US006606145B2

(12) United States Patent
Irie et al.

(10) Patent No.: US 6,606,145 B2
(45) Date of Patent: Aug. 12, 2003

(54) EXPOSURE APPARATUS, MICRODEVICE, PHOTOMASK, AND EXPOSURE METHOD

(75) Inventors: Nobuyuki Irie, Tokyo (JP); Katsuaki Ishimaru, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/793,650

(22) Filed: Feb. 27, 2001

(65) Prior Publication Data

US 2001/0019401 A1 Sep. 6, 2001

(30) Foreign Application Priority Data

Feb. 29, 2000 (JP) ........................................ 2000-054980
Feb. 1, 2001 (JP) ........................................ 2001-025257

(51) Int. Cl.[7] ........................ G03B 27/58; G03B 27/42; G03B 27/62
(52) U.S. Cl. ........................ 355/72; 355/53; 355/75
(58) Field of Search ........................ 355/53, 72–76; 310/10, 12; 378/34, 35; 414/609; 318/728–729

(56) References Cited

U.S. PATENT DOCUMENTS

| 4,842,680 | A | * | 6/1989 | Davis et al. | 156/643 |
| 5,266,812 | A | * | 11/1993 | Mokuo | 250/561 |
| 5,471,279 | A | * | 11/1995 | Takizawa | 355/73 |
| 5,991,005 | A | * | 11/1999 | Horikawa et al. | 355/53 |
| 6,168,668 | B1 | * | 1/2001 | Yudovsky | 118/715 |
| 6,190,113 | B1 | * | 2/2001 | Bui et al. | 414/672 |
| 6,213,704 | B1 | * | 4/2001 | White et al. | 414/217 |
| 6,293,749 | B1 | * | 9/2001 | Raaijmakers et al. | 414/609 |
| 6,400,445 | B2 | * | 6/2002 | Nishi et al. | 355/72 |

FOREIGN PATENT DOCUMENTS

JP      11-14810     *  1/1999

* cited by examiner

Primary Examiner—Henry Hung Nguyen
(74) Attorney, Agent, or Firm—Oliff & Berridge, PLC

(57) ABSTRACT

An exposure apparatus exposes, for example, a substrate for production of a working reticle through a master reticle on which a pattern is formed. The apparatus is provided with three support members for supporting the substrate substantially horizontally at three locations outside illuminated areas of the substrate, e.g., a pattern area, alignment mark areas, and information mark areas.

27 Claims, 19 Drawing Sheets

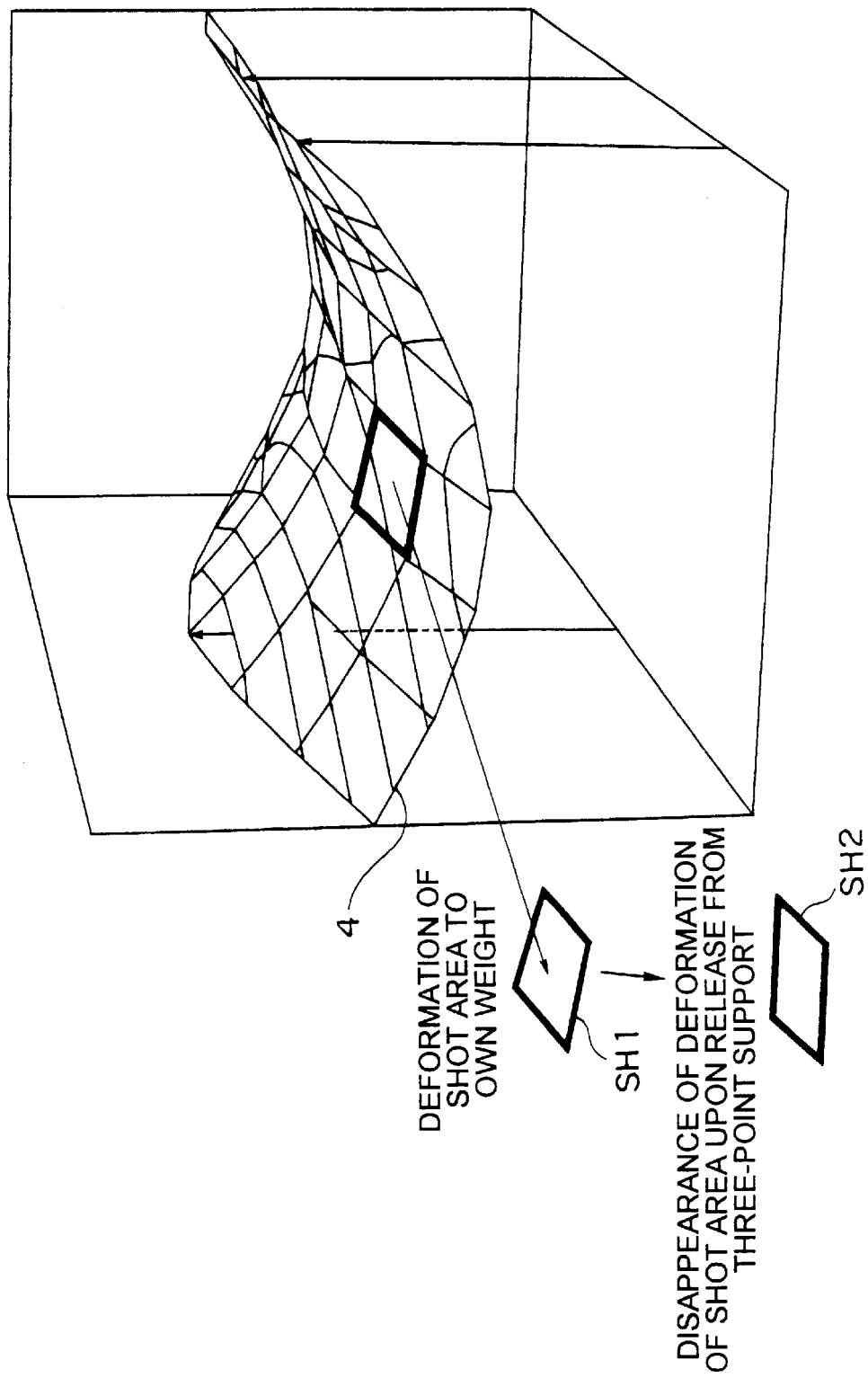

EXPOSURE APPARATUS, MICRODEVICE, PHOTOMASK, AND EXPOSURE METHOD

BACKGROUND OF THE INVENTION

1. Field of the Invention

The present invention relates to an exposure apparatus and exposure method used when producing a semiconductor integrated circuit, a liquid crystal display element, a thin film magnetic head, or another microdevice or a photomask by photolithography and to a microdevice and photomask produced using such an exposure apparatus.

2. Description of the Related Art

In photolithography, one step in the production of a microdevice, use is made of an exposure apparatus for projection exposure of an image of a pattern of a photomask or reticle (hereinafter referred to as a "reticle") on to a substrate for exposure (semiconductor wafer or glass plate coated with a photoresist). The reticle itself used for such an exposure apparatus is sometimes produced using an exposure apparatus. In the following explanation, when necessary to differentiate between the two, the former will be referred to as a "device exposure apparatus" and the latter as a "reticle exposure apparatus".

In such an exposure apparatus, the substrate on which the pattern is to be transferred and formed is loaded on a substrate stage by a transport system having a robot arm etc. and held by a holder provided with a plurality of support pins provided on the substrate stage. The positions at which the substrate is supported by the support pins are set to be near the outer circumference of the substrate so as not to damage the portion of the substrate on which the pattern is to be formed or are set to positions giving the minimum flexing of the substrate due to its own weight.

When simply placing a substrate on such support pins, the speed and acceleration of movement would be limited as it is necessary to prevent the positional deviation of the substrate accompanying step motion of the substrate stage. This would make the time required for movement longer and the throughput (production per unit time) lower. Therefore, the practice has been to form suction ports in the centers of the support pins for suction by negative pressure (vacuum) and to hold the substrate carried on the support pins by the support pins by applying negative pressure for suction through the suction ports.

Further, the practice has been to check if a substrate is loaded on the support pins by processing the record of operation of the exposure apparatus by a computer or by visual confirmation by the operator. In apparatuses applying a negative pressure to the substrate for suction, sometimes this is checked by detection by a pressure sensor of the change in the pressure when a substrate is being held by suction and not being held by suction.

When producing for example an ordinary reticle by such an exposure apparatus, however, a light blocking layer comprised of chrome (Cr) or another material not passing much light is formed on the surface of the glass substrate for reticle production (blank), so almost none of the exposure light passes through the substrate and there is not that much of a problem. When producing a special reticle such as a phase shift reticle (including a Shibuya-Levenson type, half tone type, and chromeless type) using a light blocking layer passing light to a certain extent, however, the exposure light passes through the substrate and is reflected at the surface of the support pins supporting the substrate and at the sample table and other structures present beneath the substrate. The reflected light exposes the exposure layer (photoresist) formed by coating on the substrate surface and sometimes cause a deterioration of the line width uniformity of the pattern or uniform deviation of the line width from the target line width.

Further, when the substrate is transported by the transport system, if dust etc. is deposited on the substrate supports of the robot arm or other portions with which the substrate comes into contact, this dust etc. will sometimes end up depositing on the substrate. In this case, if the substrate is supported by the support pins with the dust etc. in between them, the de facto height of the support pins will change and, along with this, the state of flexing of the substrate will differ individually. Therefore, for example, there is the problem that it is no longer possible to sufficiently eliminate error due to flexing using a correction value found in advance for the case of ideal flexing of the substrate due to its own weight and error will occur in the shape of the pattern formed. Further, the flatness becomes poor and the amount of the leveling operation increases which sometimes cause a fall in the throughput.

Further, in an apparatus in which the substrate is simply placed on the support pins, as explained above, the throughput falls, while in an apparatus in which the substrate is subjected to negative pressure for suction, the substrate is sometimes damaged by the suction and the substrate flexes locally by a large amount at the suction portions, so correction is difficult and a high accuracy pattern sometimes cannot be formed.

Further, for detecting if a substrate is present on the support pins, in a configuration applying negative pressure to the substrate for suction, the presence of a substrate is detected by detecting the pressure, but this cannot be done when not using a configuration applying negative pressure for suction. Further, in an apparatus where the presence of the substrate is detected by processing the record of operation of the transport system by computer or by visual confirmation by the operator, the reliability is poor and sometimes substrates are doubly loaded.

SUMMARY OF THE INVENTION

A main object of the present invention is to enable the production of a high accuracy, high quality photomask or microdevice.

Another object of the present invention is to enable the reliable detection of whether a substrate has been loaded onto a holder.

According to a first aspect of the present invention, there is provided an exposure apparatus, for exposing a substrate through a mask on which a pattern is formed, provided with three first support members for supporting the substrate substantially horizontally at three locations outside of illuminated areas of the substrate.

The "illuminated areas" in this case means the pattern area at which the pattern is mainly formed and alignment mark areas (areas where alignment marks are formed) or information mark areas (areas where marks comprised of a bar code, matrix code, letters, numerals, symbol, etc. where identification information and other various information are set are formed). That is, the pattern area is the area which is illuminated by the exposure light. An alignment mark area is an area which is illuminated for optical detection of the position of the alignment mark, while an information mark area is an area which is illuminated for optical detection of the information concerned.

Since the substrate is supported by the first support members at three locations outside the illuminated areas of the substrate, even when the substrate to be exposed is a light transmitting substrate (for example, a substrate for producing a phase shift reticle), the light passing through the substrate is not reflected by the first support members to expose the exposure layer of the substrate surface. Therefore, the line width uniformity of the pattern no longer deteriorates and the line width no longer deviates uniformly from the target line width and therefore a high accuracy pattern can be formed. Further, since the substrate is supported at three points, stable support can be realized.

The positions at which the substrate is supported by the first support members are preferably set to positions in an area outside the illuminated areas giving the minimum flexing of the substrate. This is because the smallest amount of flexing possible is advantageous in processing for correction of flexing.

Alternatively, the positions at which the substrate is supported by the first support members are preferably set to positions other than positions against which second support members supporting the substrate at the time of transport of the substrate abut. By setting the positions in this way, even when dust etc. deposited on portions of the second support members which the substrate contacts deposits on the substrate, since the positions of support by the first support members differ from the positions of support by the second support members, the flexing state of the substrate is not affected by the dust etc. Therefore, the substrate flexes ideally by its own weight and it becomes possible to reliably eliminate error due to flexing using a correction value found in advance for the case of ideal flexing of the substrate due to its own weight. Therefore, less error occurs in the shape of the pattern formed. Further, there is no longer an increase in the amount of the leveling operation and a decline in the throughput can be prevented.

In this case, it is possible to have the substrate supported at three points by the second support members and arrange the first support members and the second support members so that when one vertex of a first triangle formed by the first support members is designated as a first vertex, the side formed by the two vertices other than the first vertex is designated as a first base, one vertex of a second triangle formed by the second support members is designated as a second vertex, the side formed by the two vertices other than the second vertex is designated as a second base, the first base and the second base are substantially parallel, the first vertex is positioned at the second base side with respect to the first base, the second vertex is positioned at the first base side with respect to the second base, and parts of the first triangle and the second triangle overlap, the first vertex becomes substantially equal in distance from the two vertexes forming the second base and the second vertex becomes substantially equal in distance from the two vertexes forming the first base. It is therefore possible to prevent interference when the substrate is transferred from the second support members to the first support members and realize stable transfer.

In this case, preferably the surface roughness of the surface of the first support members abutting against the substrate, for example, the center axis average roughness, is set to not less than 0.1 $\mu$mRa. By setting it to such a surface roughness, the coefficient of friction between the substrate and the first support members becomes larger and the holding property of the substrate can be improved. Therefore, it is possible to increase the speed and acceleration of the step motion of the substrate to a certain extent and possible to improve the throughput. Further, since the substrate is moved at a certain speed even without being held on the first support members by suction by negative pressure etc., it is possible to prevent damage to the substrate accompanying suction by negative pressure and local flexing.

Further, it is possible to form at least the surfaces of the first support members abutting against the substrate (portions including the surfaces) by one of diamond, sapphire, ruby, and ceramic. The first support members as a whole may be formed by such materials or the first support members may be formed by providing a coating layer of such a diamond or other material on the surface of a base material of another material.

The surfaces of the first support members against which the substrate abuts (tip surfaces) may be made substantially circular and, in consideration of the surface roughness and material of the tip surfaces and the maximum speed and maximum acceleration of the substrate, the diameter set to 0.5 to 30 mm or so so as to prevent the substrate from shifting on the first support members.

The apparatus should desirably have an anti-reflection member provided under the substrate to prevent light reflection. Unless the anti-reflection member is thus provided, the light having passed through the substrate would be reflected by a structure such as the sample table on which the first support members are provided to cause the accuracy of the pattern sometimes to deteriorate as in the above. By providing such an anti-reflection member, however, the light passing through the substrate is absorbed by the anti-reflection member and less reflected light is produced, so this problem is solved.

The apparatus can further be provided with a moving body supporting at a plurality of places a substrate holder having the three first support members. In this case, the substrate holder should desirably be kinematically supported at three points different in position from the three first support members. The "kinematic supporting" refers herein to a manner of supporting which will provide a restriction in at least one direction in a horizontal plane. For example, there are provided at one of the substrate holder and the moving body hemispherical projections corresponding to vertexes of a triangle while there are provided at the other of the substrate holder and moving body a conical concavity, V-shaped concavity and flat surface corresponding to the hemispherical projections, respectively.

The apparatus is preferably further provided with a sensor for optically detecting if a substrate is supported by the first support members. This enables reliable detection of the presence of a substrate and enables prevention of double loading of substrates etc.

In this case, when the substrate is formed to a substantially rectangular shape, it is possible to adopt a sensor having a light emitter for outputting detection light and a light receiver for receiving the detection light from the light emitter and to arrange the light emitter and the light receiver so that the detection light strikes one surface of the substrate at an angle of about 45° in the state with the substrate supported by the first support members. At this time, preferably a corner of the substrate is used as much as possible so that the detection light does not reach the illuminated areas of the substrate. The wavelength of the detection light is different from the wavelength of the exposure light for transfer of the pattern, but this is to reduce as much as possible the effect on the exposure layer of the substrate surface.

According to a second aspect of the present invention, there is provided an exposure apparatus, for exposing a substrate through a mask on which a pattern is formed, provided with a moving body having a plurality of supports whose surfaces abutting against the substrate have a surface roughness of 0.1 μmRa or more. The area of each of the supports which abuts against the substrate should desirably be substantially circular and have a diameter of about 0.5 to 30 mm. Also, the moving body may be adapted to support, at a plurality of places, the substrate holder having the plurality of supports. Further, the moving body may be adapted to kinematically support the substrate holder at places different from those of the plurality of supports.

According to a third aspect of the present invention, there is provided an exposure apparatus, for exposing a substrate through a mask on which a pattern is formed, provided with a substrate holder on which the substrate is placed, and a moving body supporting the substrate holder substantially horizontally at three locations. In this case, the substrate holder should desirably be kinematically coupled on the moving body.

Further, while not particularly limited to this, in the exposure apparatuses according to the first to third aspects of the present invention, the mask may be a master mask and the substrate may be a mask substrate for producing a working mask. In this case, it is possible to enlarge the pattern for transfer, divide the pattern thus obtained into a plurality of parent patterns, and transfer reduced images of the parent patterns obtained by a projection optical system on a plurality of areas with surroundings partially overlapping on the mask substrate.

In the above exposure apparatuses according to the first to third aspects of the present invention, the mask may be a master mask and the substrate may be a mask substrate for producing a working mask. In this case, each of the apparatuses may further be provided with an alignment mechanism for aligning the substrate, before exposure of the substrate, using reference positions the same as at least three reference positions to be used for alignment of the working mask in another type of exposure apparatus (device exposure apparatus) in which the working mask produced using the exposure apparatus (reticle exposure apparatus) is to be used.

Since the external references of the substrate used when transferring and forming a pattern to the substrate are made the same as those of the working mask (substrate) used for alignment in another exposure apparatus where the working mask produced using this substrate is to be used, there occurs less error than in the case of alignment using different external references and therefore it is possible to improve the positional alignment between the master mask and the other substrate to be exposed by the other exposure apparatus (called the "device substrate" for convenience in differentiating it from the substrate of the working mask) and as a result possible to form a pattern with a high accuracy on the device substrate.

According to a fourth aspect of the present invention, there is provided a microdevice produced using an exposure apparatuses provided according to any of the first to third aspects of the present invention.

According to a fifth aspect of the present invention, there is provided a device producing method including a lithography step in which an exposure apparatus provided according to any of the first to third aspects of the present invention is used.

According to a sixth aspect of the present invention, there is provided a photomask produced using an exposure apparatus provided according to any of the first to third aspects of the present invention.

According to a seventh aspect of the present invention, there is provided a photomask producing method including a lithography step in which an exposure apparatus provided according to any of the first to third aspects of the present invention.

According to an eighth aspect of the present invention, there is provided an exposure method for exposing a substrate through a mask on which a pattern is formed, the method including exposing the substrate being held substantially horizontally at three locations outside of illuminated areas of the substrate.

BRIEF DESCRIPTION OF THE DRAWINGS

These and other objects and features of the present invention will become clearer from the following description of the preferred embodiments given with reference to the attached drawings, in which:

FIG. 14 is a schematic view of flexing accompanying support of a blank;

DESCRIPTION OF THE PREFERRED EMBODIMENTS

Figure 1:
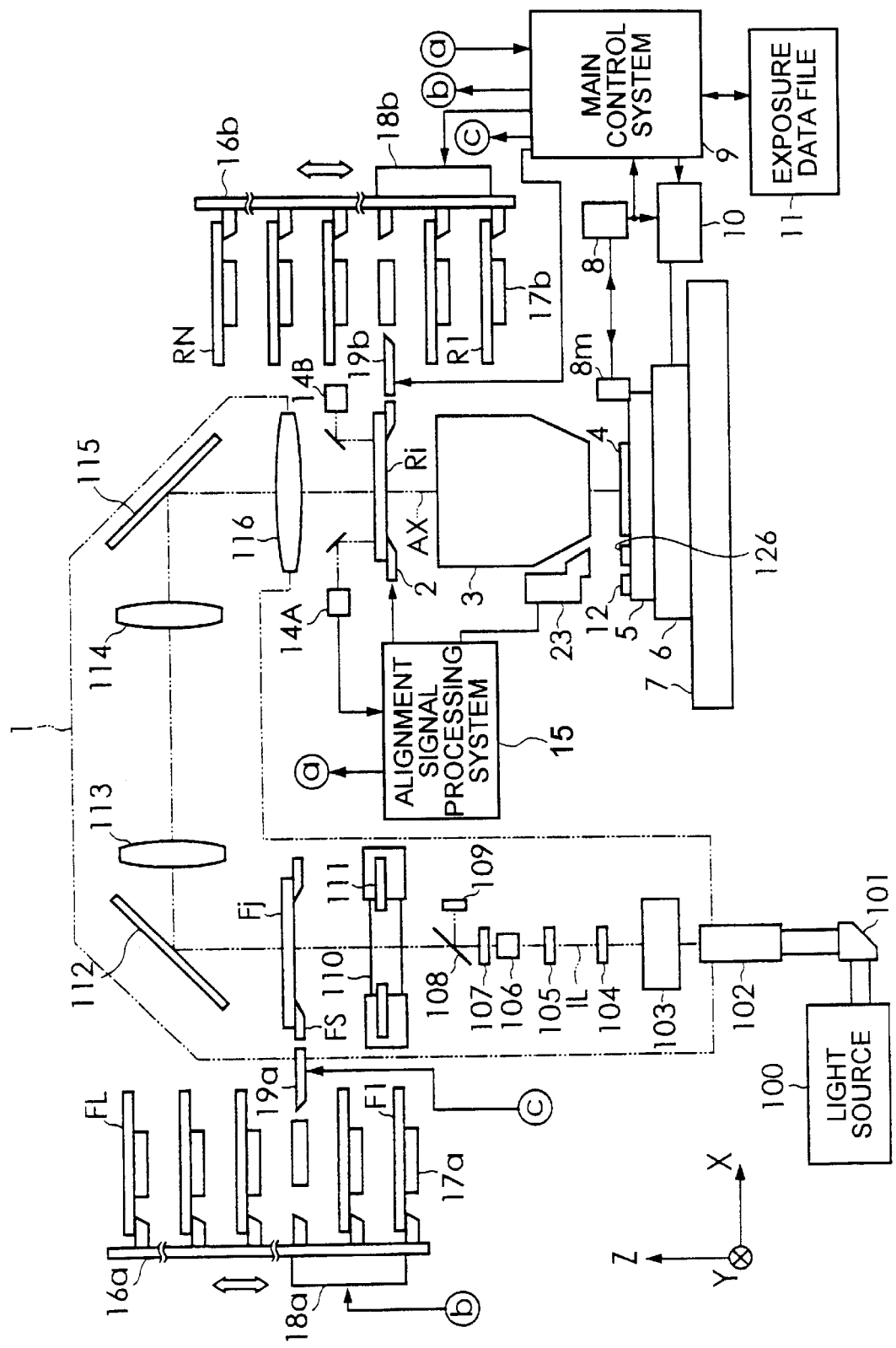
FIG. 1 is a view of the general configuration of an exposure apparatus according to an embodiment of the present invention.

Below, an explanation will be given of an embodiment of the present invention with reference to the drawings. FIG. 1 is a view of the general configuration of an exposure apparatus according to an embodiment of the present invention. The exposure apparatus is a step-and-repeat type stitching projection exposure apparatus. In the following explanation, the XYZ orthogonal coordinate system shown in FIG. 1 is set and the positional relationships of the members explained while referring to the XYZ orthogonal coordinate system. The XYZ orthogonal coordinate system is set so that the X-axis and the Z-axis become parallel to the paper surface and so that the Y-axis becomes the direction orthogonal to the paper surface. Further, the XYZ coordinate system in the figure is set so that the XY plane becomes a plane parallel to the horizontal surface and the Z-axis becomes the perpendicular direction.

In FIG. 1, the ultraviolet pulse light IL of the light from a light source 100 (here, an ArF excimer laser) (hereinafter referred to as the "exposure light IL") passes through a beam matching unit (BMU) 101 including movable mirrors etc. for matching of the position of the optical path with the illumination optical system 1 and enters a variable light attenuator 103 serving as a light attenuator through a pipe 102.

A main control system 9 controls the amount of exposure of the resist on the substrate 4 by communicating with the light source 100. The main control system 9 controls start and stop emission of light, the oscillation wavelength, and the output as determined by the pulse energy and adjusts the light attenuation rate of the variable light attenuator 103 with respect to the exposure light IL in stages or continuously.

The exposure light IL passing through the variable light attenuator 103 passes through a beam shaping optical system comprised of lens systems 104 and 105 arranged along a predetermined light axis and enters an optical integrator (rod integrator or fly-eye lens etc., in the figure, a fly-eye lens). Further, two fly-eye lenses 106 may be arranged in series to enhance the uniformity of illumination distribution.

An aperture stop system 107 is arranged at the emission surface of the fly-eye lens 106. The aperture stop system 107 includes a circular aperture stop for normal illumination, an aperture stop for modified illumination comprised of a plurality of small offset apertures, an aperture stop for annular illumination, etc. arranged in a switchable manner. The illumination light IL emitted from the fly-eye lens 106 and passing through a predetermined aperture stop of the aperture stop system 107 enters a beam splitter 108 having a high transmittance and a low reflectance. The light reflected at the beam splitter 108 enters an integrator sensor 109 comprised of a photoelectric detector. The detection signal of the integrator sensor 109 is supplied through a not illustrated signal line to the main control system 9.

The transmittance and reflectance of the beam splitter 108 are measured to a high accuracy in advance and stored in a memory in the main control system 9. The main control system 9 is designed to be able to monitor the amount of exposure light IL entering the projection optical system 3 indirectly by the detection signal of the integrator sensor 109.

The exposure light IL passing through the beam splitter 108 enters a reticle blind mechanism 110. The reticle blind mechanism 110 is comprised of four movable blinds 111 and their drive mechanisms. By setting these four blinds 111 at suitable positions, a rectangular illumination field is formed at the approximate center of the field of the projection optical system 3.

Figure 2A:
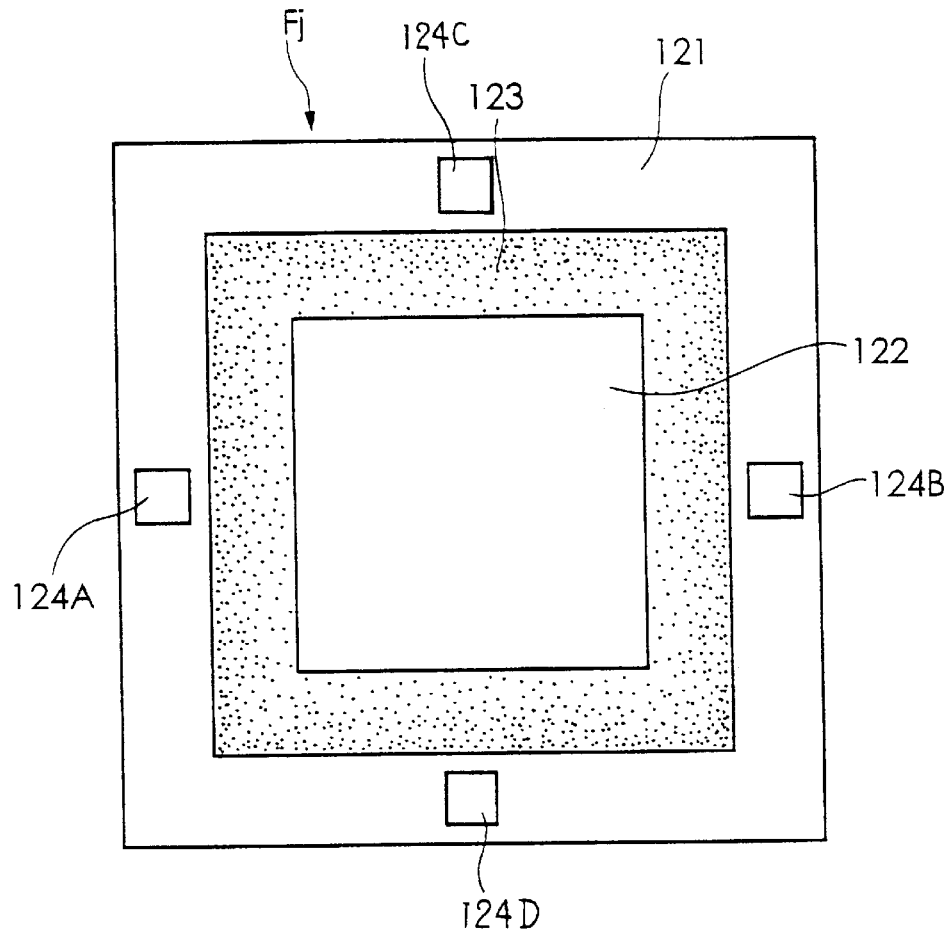
FIG. 2A is a top view of the configuration of a density filter.

The exposure light IL shaped into a rectangle by the blinds 111 of the reticle blind mechanism 110 enters a density filter Fj arranged on a filter stage FS. The density filter Fj (here, the nine filters F1 to F9) is basically configured as shown in FIG. 2A. FIG. 2A is a top view of an example of the configuration of the density filter Fj. The density filter Fj is comprised of a light transmitting substrate of a quartz glass, a quartz glass having fluorine doped therein or the like on which are formed a light blocking portion 121 on which chrome or another light blocking material is deposited, a light transmitting portion 122 on which no light blocking material is deposited, and a light attenuating portion 123 on which the light blocking material is deposited while changing the probability of presence. The light attenuating portion 123 has the light blocking material deposited on it in dots. The size of the dots becomes less than the resolution limit of an optical system having a plurality of optical elements (112 to 116) arranged between the density filter Fj and master reticle Ri in this embodiment in the state where the density filter Fj is placed at the position shown in FIG. 1. The dots are formed to increase in probability of presence so that the light attenuation rate becomes higher by a straight line the further from the inside (light transmitting portion 122 side) to the outside (light blocking portion 121 side). The dots may however also be formed by increasing their probability of presence so that the light attenuation rate becomes higher in a curve the further from the inside to the outside.

The dots are preferably arranged not by arrangement of dots by the same pitch P at the same transmittance portion, but by arrangement by addition to P of a random number R having a Gaussian distribution generated for each dot, that is, a P+R system. The reason is that diffracted light is produced by the arrangement of dots. In some cases, the numerical aperture (NA) of the illumination system is exceeded and light does not reach the photosensitive substrate and therefore the error from the design transmittance becomes large.

Further, the sizes of the dots are preferably all the same. The reason is that if several sizes of dots are used, when error occurs from the design transmittance due to the aforementioned diffraction, the error becomes complicated, that is, correction of the transmittance becomes complicated.

The density filter is preferably produced by a high speed electron beam lithography system so as to reduce the error in the dot shape. Further, the shape of the dots is preferably a rectangular shape (square shape) for which process errors in shape can be easily measured. This has the advantage of easy correction of the transmittance in the case of any measurable shape error.

Figure 2B:
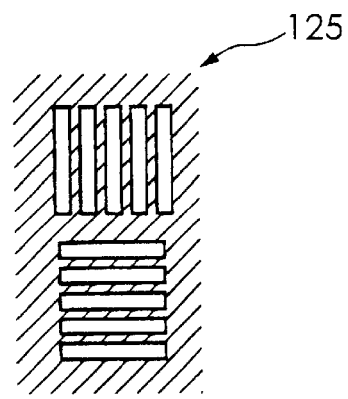
FIG. 2B is a view of an example of a mark formed on a density filter.

The light blocking portion 121 is formed with a plurality of alignment marks 124A, 124B, 124C, and 124D. These marks 124A, 124B, 124C, and 124D, as shown in FIG. 2A, can be formed by removing parts of the light blocking portion 121 of the density filter Fj to form rectangular or other shaped apertures (light transmitting portions) 124A, 124B, 124C, and 124D. Further, it is possible to use the marks shown in FIG. 2B. FIG. 2B is a top view of an example of a mark formed on a density filter Fj. In FIG. 2B, use is made of a slit mark 125 comprised of a plurality of slit-shaped apertures. The slit mark 125 is comprised of a combination of a mark element comprised of slits formed in a Y-direction aligned in an X-direction and a mark element comprised of slits formed in an X-direction aligned in a Y-direction for measurement of the positions in the X-direction and Y-direction. The position and projection magnification of the density filter Fj are adjusted based on the results of measurement of the positional information of the marks 124A, 124B, 124C, and 124D. Further, for the position of the density filter Fj in the Z-direction and the amount of tilt in the Z-direction, the density filter Fj is moved in optical axis direction using an apparatus provided at least partially on the sample table 5 to detect, by its image pickup element, the marks of the density filter Fj, or the like to measure the marks 124A, 124B, 124C, and 124D or the mark 125 at a plurality of Z-directions, and the Z-position giving the largest signal intensity or signal contrast is designated as the best focus position. The density filter Fj may be arranged at this best focus position (conjugate with an object plane or imaging plane of the projection exposure apparatus 3, namely, conjugate with the surface of the master reticle Ri on which the pattern is to be formed or the surface of the substrate 4). In this embodiment, however, the density filter is arranged at the position of a certain amount of defocus from that best focus position.

Further, the number of marks set at the density filter is not limited to four. It is sufficient to set one or more in accordance with the accuracy setting etc. of the density filter. Further, in this example, the density filter was arranged so as to substantially match with the optical axis of the illumination optical system at its center and four marks were provided symmetrically with respect to the center (optical axis), but when providing a plurality of marks at the density filter, it is preferable to arrange the plurality of marks so as not to become point symmetric with respect to the center or to arrange the plurality of marks point symmetrically and form an identification pattern separately. This is so that when arranging the density filter in the illumination optical system, measuring the energy distribution, then taking out the density filter, making corrections, and resetting it, since the density filter is corrected taking into consideration the optical characteristics (distortion etc.) of the illumination optical system, if the density filter is reset rotated, the correction will become meaningless, that is, this is for enabling the density filter to be reset in its original state.

In the present embodiment, there are nine density filters Fj, that is, the filters F1 to F9 shown in FIG. 3A to FIG. 3I. FIG. 3A to FIG. 3I are views of the configurations of the density filters provided in the exposure apparatus of the embodiment of the present invention. These differ from each other in the shapes or positions of the light attenuating portions 123 and are selectively used in accordance with whether there are portions where the images of patterns overlap between adjoining shot areas at the four sides of the shot areas to be exposed (hereinafter referred to as "stitching portions").

Figure 3A:
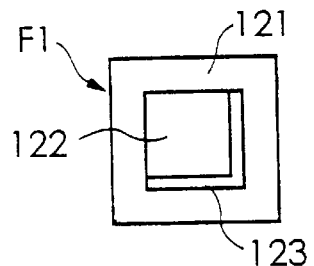
FIG. 3A to FIG. 3I are views of configurations of light attenuating portions of density filters.
Figure 3B:
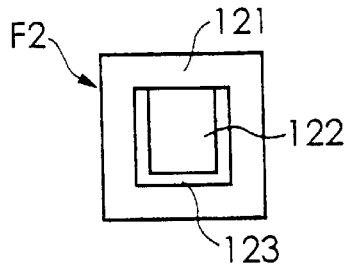
Figure 3C:
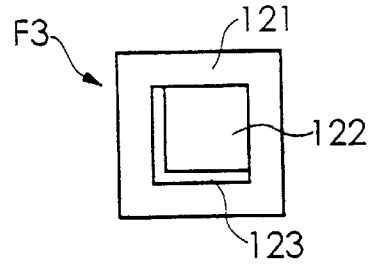
Figure 3D:
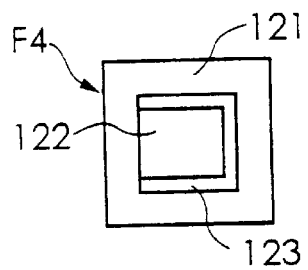
Figure 3E:
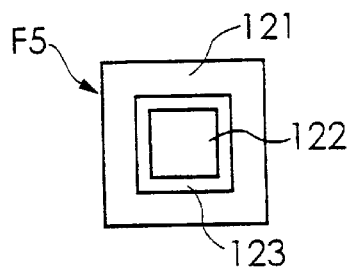
Figure 3F:
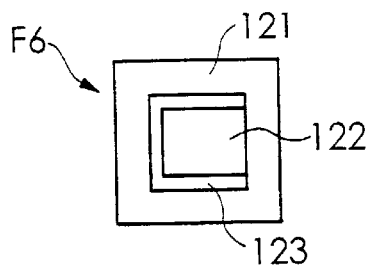
Figure 3G:
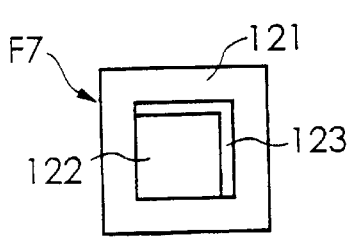
Figure 3H:
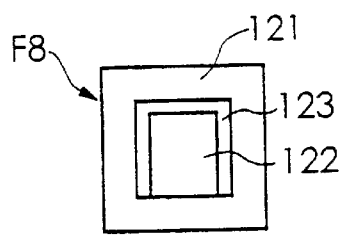
Figure 3I:
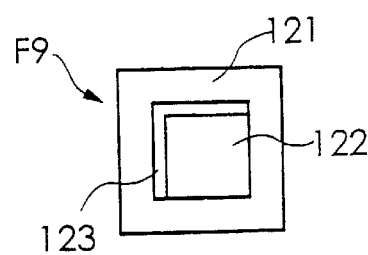

That is, in the case of a shot matrix of P (rows) x q (columns), the density filter of FIG. 3A is used for the shot (1,1), the density filter of FIG. 3B is use for the shot (1,2 to q–1), the density filter of FIG. 3C is used for the shot (1,q), the density filter of FIG. 3D is used for the shot (2 to p–1, 1), the density filter of FIG. 3E is used for the shot (2 to p–1, 2 to q–1), the density filter of FIG. 3F is used for the shot (2 to p–1, q), the density filter of FIG. 3G is used for the shot (p,1), the density filter of FIG. 3H is used for the shot (p,2 to q–1), and the density filter 3I is used for the shot (p, q).

Further, the density filter Fj is not limited to the above nine types. It is possible to use ones having light attenuating portions 123 of other shapes in accordance with the shape of the shot areas and the shot matrix. The density filters Fj may be provided in a one-to-one correspondence with the master reticles Ri, but use of the same density filter Fj for exposure of several master reticles Ri enables the number of the density filters Fj to be reduced and is more efficient.

If the density filters Fj are made able to be used rotated 90 degrees or 180 degrees, by preparing for example the three types of density filters Fj of FIG. 3A, FIG. 3B, and FIG. 3E, the other density filters become unnecessary and efficiency is greater. Further, if the single density filter Fj shown in FIG. 3E is used and the positions of the four blinds 111 of the reticle blind mechanism 110 are selectively set or a light blocking band of the master reticle Ri is used to block one or more of the four sides of the light attenuating portion 123 by the corresponding blinds 111, it is possible to realize the functions of the density filters shown in FIG. 3A to FIG. 3I and other density filters by a single density filter.

Further, the density filter Fj is not limited to one comprised of a glass substrate formed with a light attenuating portion or light blocking portion by chrome etc. Use may also be made of ones using liquid crystal elements etc. to enable the positions of the light blocking portions or light attenuating portions and the light attenuating characteristics of the light attenuating portions to be changed in accordance with need. In this case, there is no longer a need to prepare several density filters and various demands in the specifications of the working reticles (microdevices) produced can be flexibly dealt with.

The filter stage FS indexes or moves the density filters Fj held in the rotational direction or translational direction in the XY plane. Not shown laser interferometers are used to measure the X-coordinate, Y-coordinate, and rotational angle of the filter stage FS. The operation of the filter stage FS is controlled by the measured values and the control information from the main control system 9. Details of the method of setting the light attenuating portions 123 of the density filters Fj explained above and the method of producing the density filters Fj will be explained later.

The exposure light IL passing through a density filter Fj travels via a reflection mirror 112 and condenser mirror 113, an imaging lens system 114, a reflection mirror 115, and a main condenser lens system 116 to strike an illuminated area similar to the rectangular aperture of the blinds 111 on the circuit pattern area of the master reticle Ri by a uniform intensity distribution. That is, the plane of arrangement of the apertures of the blinds 111 is substantially conjugate with the pattern formation surface of the master reticle Ri due to the combined system of the condenser lens system 113, the imaging lens system 114, and the main condenser lens system 116.

The exposure light IL emitted from the illumination optical system 1 illuminates a master reticle Ri held on the reticle stage 2. The reticle stage 2 holds the i-th (i=1 to N) master reticle Ri.

In the present embodiment, a shelf-like reticle library 16b is arranged at the side of the reticle stage 2. This reticle library 16b has N number (N is a natural number) of support shelves 17b successively arranged in the Z-direction. Master reticles R1, . . . , RN are carried on the support shelves 17b. The reticle library 16b is supported to be movable in the Z-direction by a slider 18b. A loader 19b able to freely rotate and provided with an arm able to move in a predetermined range in the Z-direction is arranged between the reticle stage 2 and the reticle library 16b. The main control system 9 adjusts the position of the reticle library 16b in the Z-direction through the slider 18b, then controls the operation of the loader 19b to enable transfer of desired master reticles F1 to FL between the desired support shelves 17b of the reticle library 16b and the reticle stage 2.

The image of the pattern in the illuminated area of the master reticle Ri is projected on the surface of the substrate for the working reticle (blank) 4 at a reduction rate $1/\alpha$ ($\alpha$ is for example 5, 4, etc.) through a projection optical system 3. In this embodiment, the working reticle 34 is a half tone type phase shift reticle and is comprised of a light transmitting substrate comprised of quartz glass etc. formed on one surface with a master pattern 27 by a half tone film designed for a transmittance of 10 to several percent and made of a chrome-based (CrON), molybdenum-based (MoSiON), tungsten-based (WSiON), silicon-based (SiN), or other mask material.

The working reticle 34 is not limited to a half tone type and may also be a spatial frequency modulated type (Shibuya-Levenson type) or chromeless type or other phase shift reticle. With a spatial frequency modulated type phase shift reticle, a phase shifter is patterned over the chrome or other light blocking pattern on the blank. The exposure apparatus of the present embodiment is particularly effective when forming a light blocking pattern by a mask material having light transmittance or when forming a phase shifter, but is also suitable for when forming a master pattern 27 for transfer by a usual mask material such as chrome (Cr) which does not pass much light at all.

Figure 4:
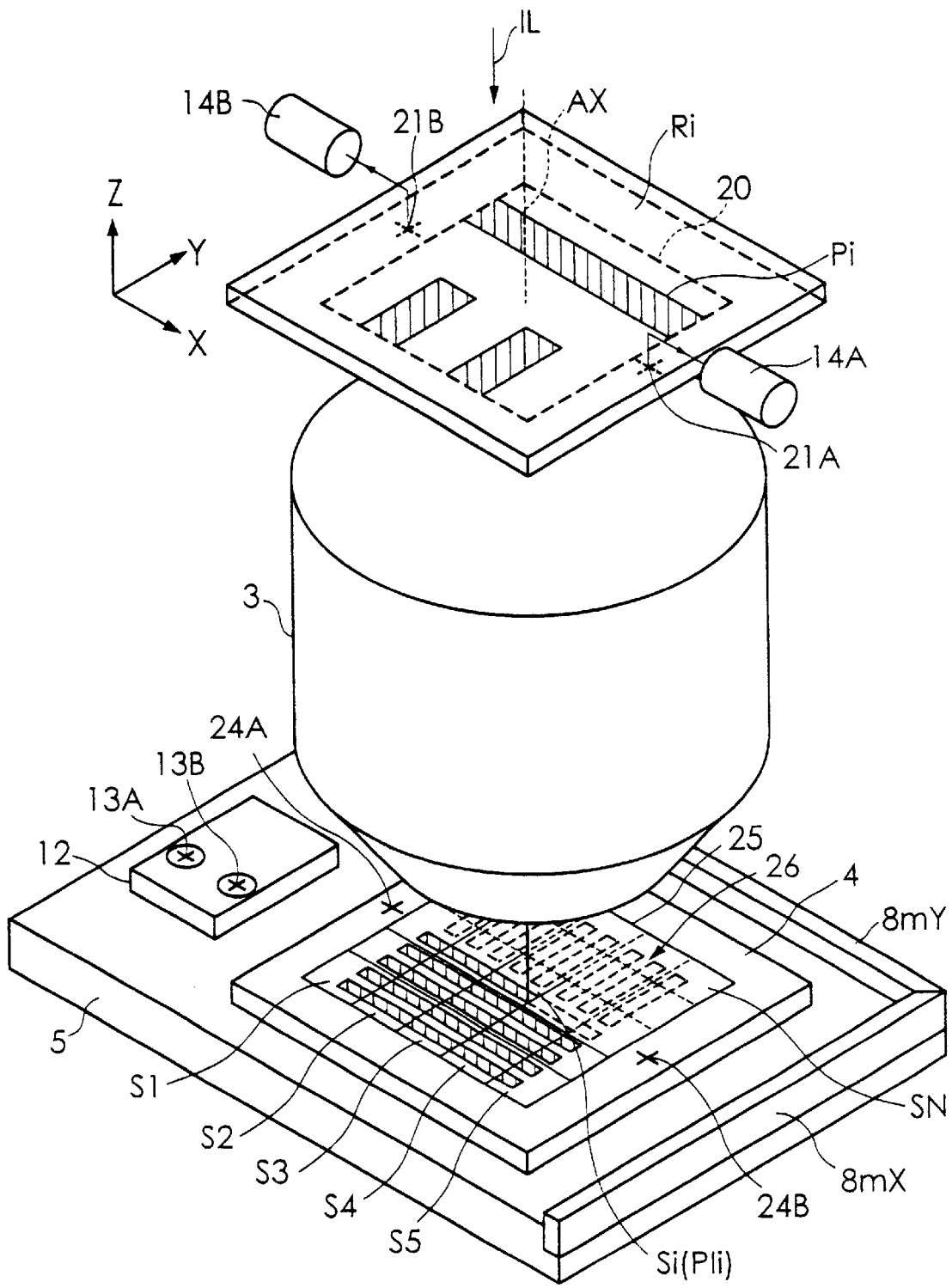
FIG. 4 is a perspective view of the case when projecting a reduced image of a parent pattern of a master reticle on a substrate.
Figure 9:
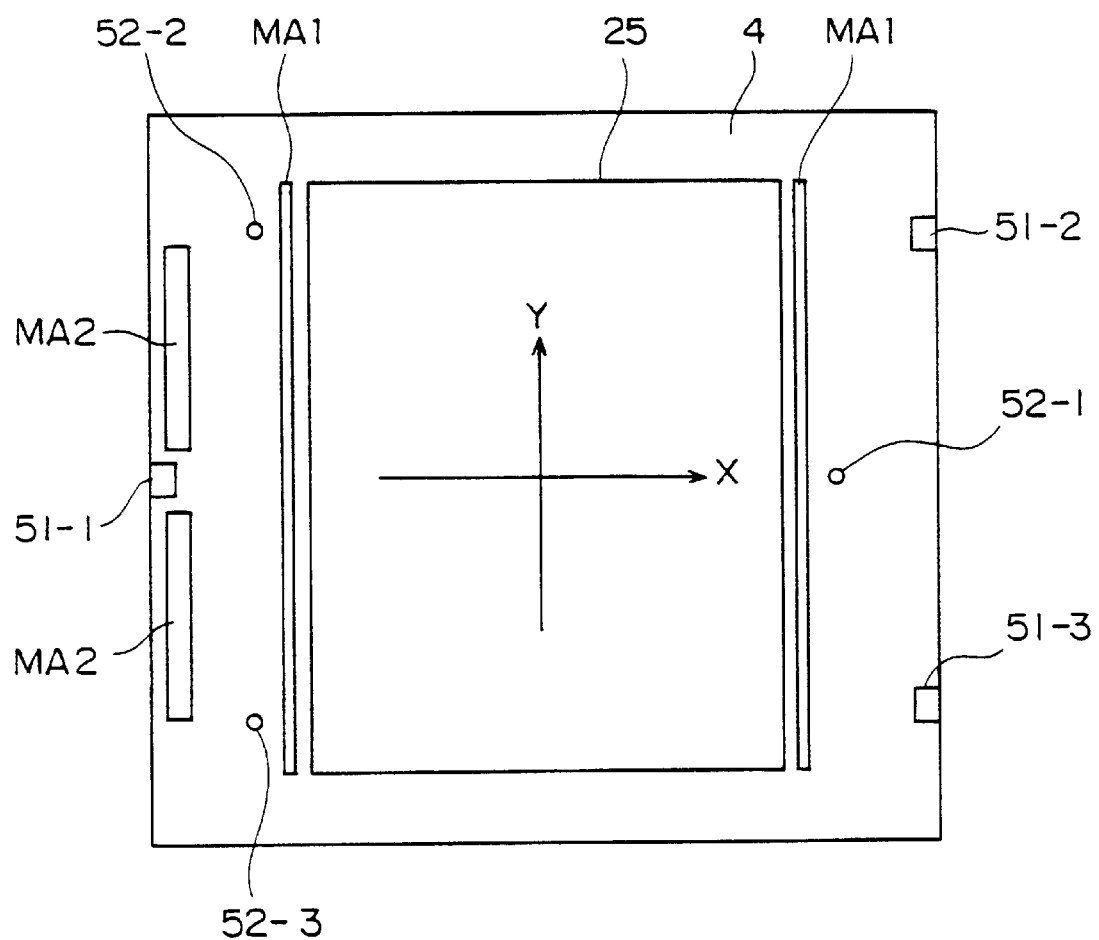
FIG. 9 is a plane view for explaining a positional relationship between illuminated areas of a substrate and support pins.

FIG. 4 is a perspective view showing the case of projecting a reduced image of a parent pattern of a master reticle on to a substrate. FIG. 9 is a top view of details of the substrate 4. The reticle stage 2 positions the master reticle Ri carried on it in the XY plane. The position and rotational angle (amounts of rotation about the X-axis, Y-axis, and Z-axis) of the reticle stage 2 are measured by not shown laser interferometers. The operation of the reticle stage 2 is controlled by the measured values and the control information from the main control system 9.

The substrate 4 to be exposed to produce the working reticle 34 is comprised of light transmitting quartz glass. On the pattern area on its surface (area to be illuminated by exposure light IL and on which pattern is actually to be formed) 25 is formed a thin film comprised of a mask material for a half tone. On the substrate 4 are arranged a pair of mark areas MA1 for alignment marks straddling the pattern area 25.

Alignment marks 24A and 24B comprised of two 2-dimensional positioning marks are formed in the mark areas MA1. Note that these alignment marks 24A and 24B are examples. An alignment mark is sometimes formed across a substantially entire mark area MA1. The alignment mark areas MA1 are illuminated by illumination light of a wavelength suitable for alignment sensors when detecting them by such alignment sensors.

Further, information mark areas MA2 in which identification information of the substrate 4 and other various information are set are arranged at positions different from the pattern area 25 and the alignment mark areas MA1. The information mark areas MA2 are set with bar codes, matrix codes, and desired information by letters, graphics, numerals, symbols, etc. The information mark areas MA2 are illuminated with illumination light of a wavelength suitable for a reading sensor when read by such a reading sensor.

The alignment marks 24A and 24B and the various information marks are formed in advance before transfer of the parent pattern by using an electron beam lithography system, laser beam lithography system, projection exposure apparatus (stepper, scanner), etc. Further, the surface of the substrate 4 is coated with a photoresist so as to cover the mask material.

FIG. 4 shows the state with the substrate 4 set on the sample table 5, but an explanation will now be given of the transport process before the substrate 4 is set on the sample table 5. A plurality of substrates 4 are accommodated in a not shown substrate cassette which is loaded on to a cassette table positioned near the exposure apparatus. The substrates 4 in the substrate cassette are successively taken out and transported by a not shown transport system and loaded on to a substrate holder provided on the sample table 5. In the substrate cassette, the substrates 4 are supported by substrate supports (second support members) of shelves provided inside the substrate cassette at the four locations shown by the references TA1 in FIG. 10. This transport system has a robot arm 50 as shown in FIG. 11. The substrates 4 are transported supported by the substrate supports 50A (second support members) formed on the robot arm 50 at the four locations shown by the references TA2 in FIG. 10.

Further, while a detailed illustration is omitted, the sample table 5 is provided, separate from the support holder, with a center table (CT) having three substrate supports (second support members) able to be elevated and able to rotate slightly overall. A substrate 4 transported by the robot arm is moved by being lowered from above on to the three substrate supports 51 (see FIG. 9) of the center table in the elevated state. The positions at which the three substrate supports 51 of the center table support the substrate 4 are shown by the references TA3 in FIG. 10. Next, the center table is made to descend to move the substrate 4 on to the substrate holder comprised of the three support pins 52. The positions at which the support pins 52 support the substrate 4 are shown by the references TA4 in FIG. 10.

The three support pins (first support members) 52 of the substrate holder and the three supports (second support members) 51 of the center table are arranged in the positional relationship best shown in FIG. 9. Here, one vertex of a first triangle formed by the support pins 52 is designated at the first vertex 52-1, the side comprised by the two vertices 52-2, 52-3 other than the first vertex is designated as the first base, one vertex of a second triangle formed by the substrate supports 51 is designated as the second vertex 51-1, and the side comprised by the two vertices 51-2 and 51-3 other than the second vertex is designated as the second base. The support pins 52 and the substrate supports 51 are arranged so that the first base and the second base become substantially parallel, the first vertex 52-1 is positioned at the second base side from the first base, the second vertex 51-1 is positioned at the first base side from the second base, and, when the first triangle and the second triangle partially overlap, the first vertex becomes substantially equal in distance from the two vertexes forming the second base and the second vertex becomes substantially equal in distance from the two vertexes forming the first base. By arranging the members in this way, interference between the substrate supports 51 and the support pins 52 is prevented and stable transfer can be realized.

Next, details of the three support pins 52 comprising the substrate holder provided on the sample table 5 will be explained with reference to FIG. 9, FIG. 10, FIG. 12, and FIG. 13. The support pins 52 are for supporting the substrate 4 substantially horizontally and, as shown in FIG. 9, are arranged at positions other than the illuminated areas of the substrate 4, that is, the pattern area 25, the alignment mark areas MA1, and the information mark areas MA2, when the substrate 4 is placed on the support pins 52, and positions giving the least flexing of the substrate 4.

Figure 12:
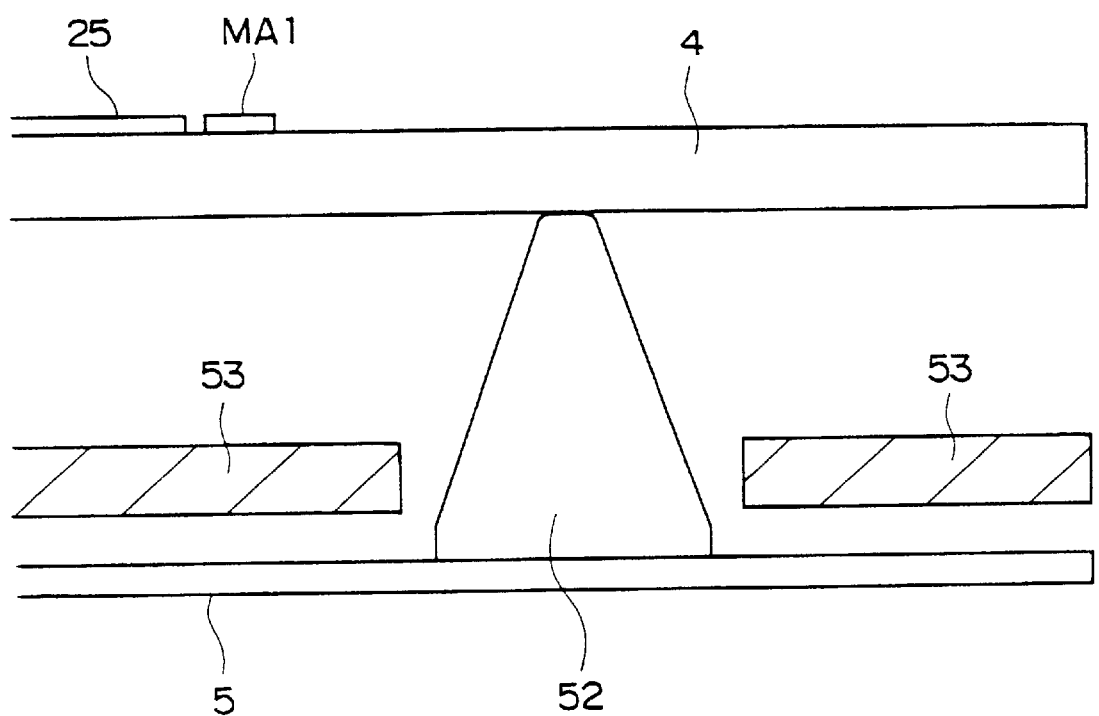
FIG. 12 is a sectional view of a support pin and its surroundings.

These support pins 52, as shown in FIG. 12, are formed tapered so as to become thinner toward the tips (top parts). The tip surfaces where the substrate 4 is placed are flat surfaces. The diameter of each tip surface is preferably set to 0.5 to 30 mm or so. In this embodiment, it is set to 1.5 mm. These support pins 52 are formed from either diamond, sapphire, ruby, ceramic, etc. The support pins 52 may be formed entirely from these materials or may be formed by covering the surface of a metal or other base material with these materials or only the portions of the tips which contact the substrate 4 may be formed from these materials.

Further, the tip surfaces of the support pins 52 contacting the substrate 4 are set to a surface roughness of about 0.1 μmRa (center line average roughness) or more so as to increase the coefficient of friction with respect to the substrate 4 and improve the holding property of the substrate 4. In the present embodiment, the tip surfaces of the support pins 52 are made uniformly flat surfaces, but it is also possible to form negative pressure suction ports in the centers and hold the substrate 4 softly (suction by negative pressure weaker than the conventional vacuum suction and of an extent not causing that much deformation of the substrate 4).

Figure 10:
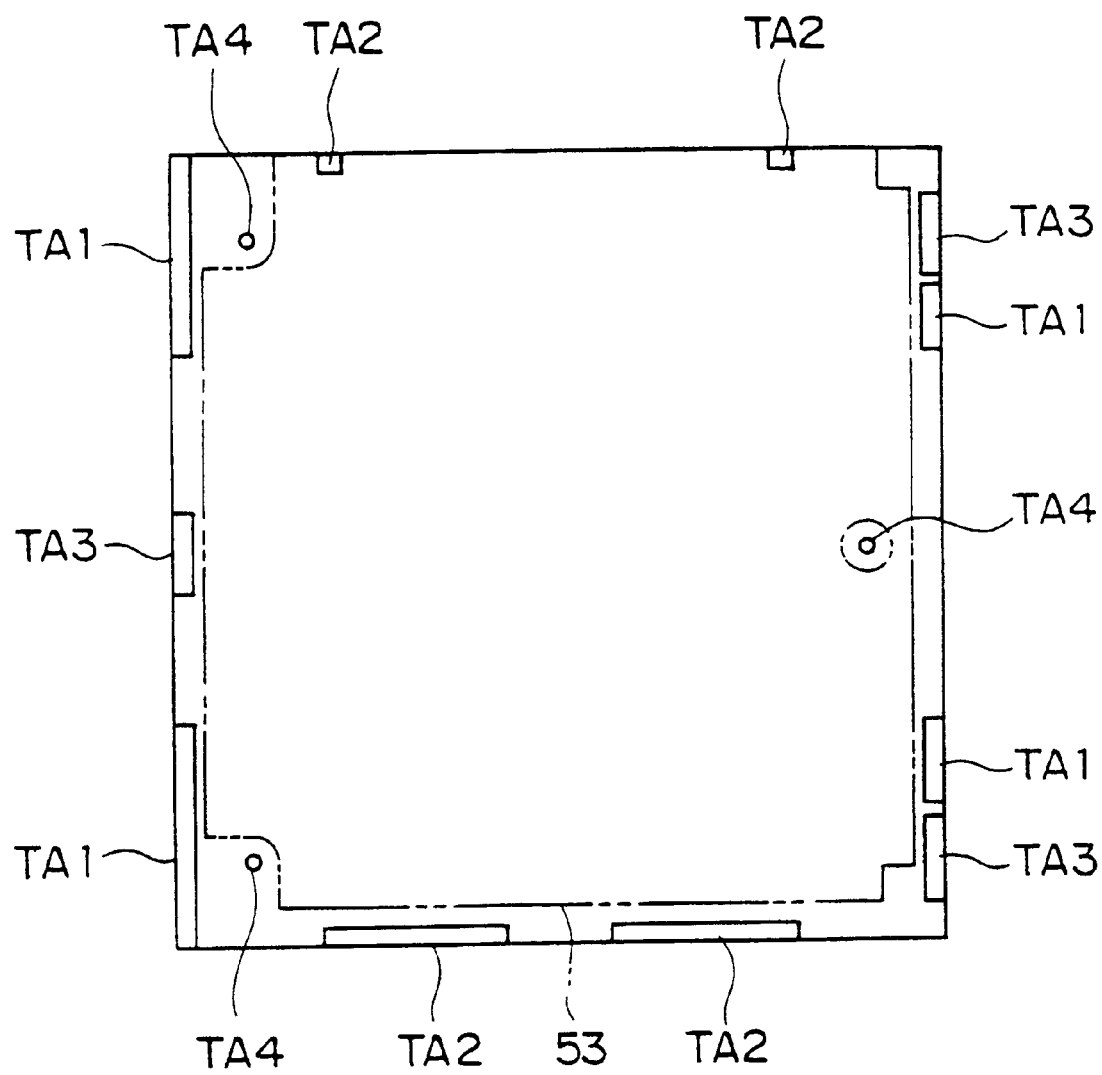
FIG. 10 is a plane view for explaining support positions of a substrate.
Figure 11:
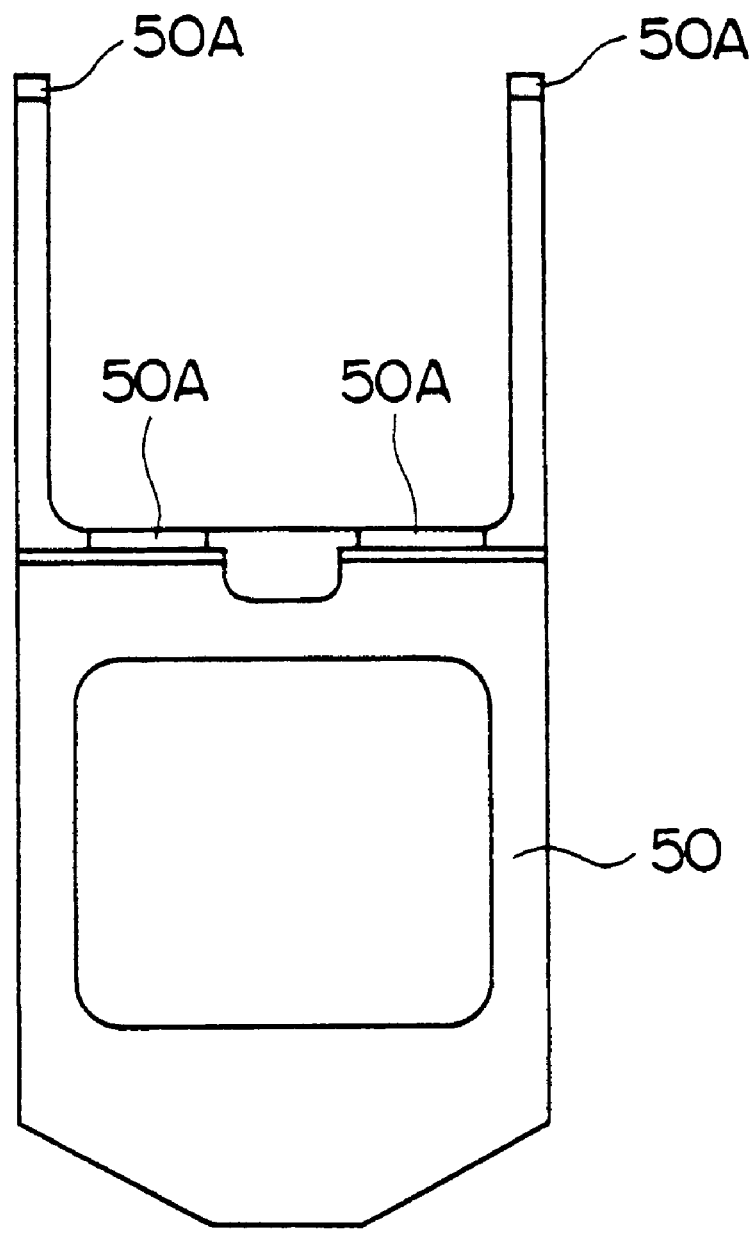
FIG. 11 is a plane view of the configuration of a robot arm of a transport system.
Figure 13:
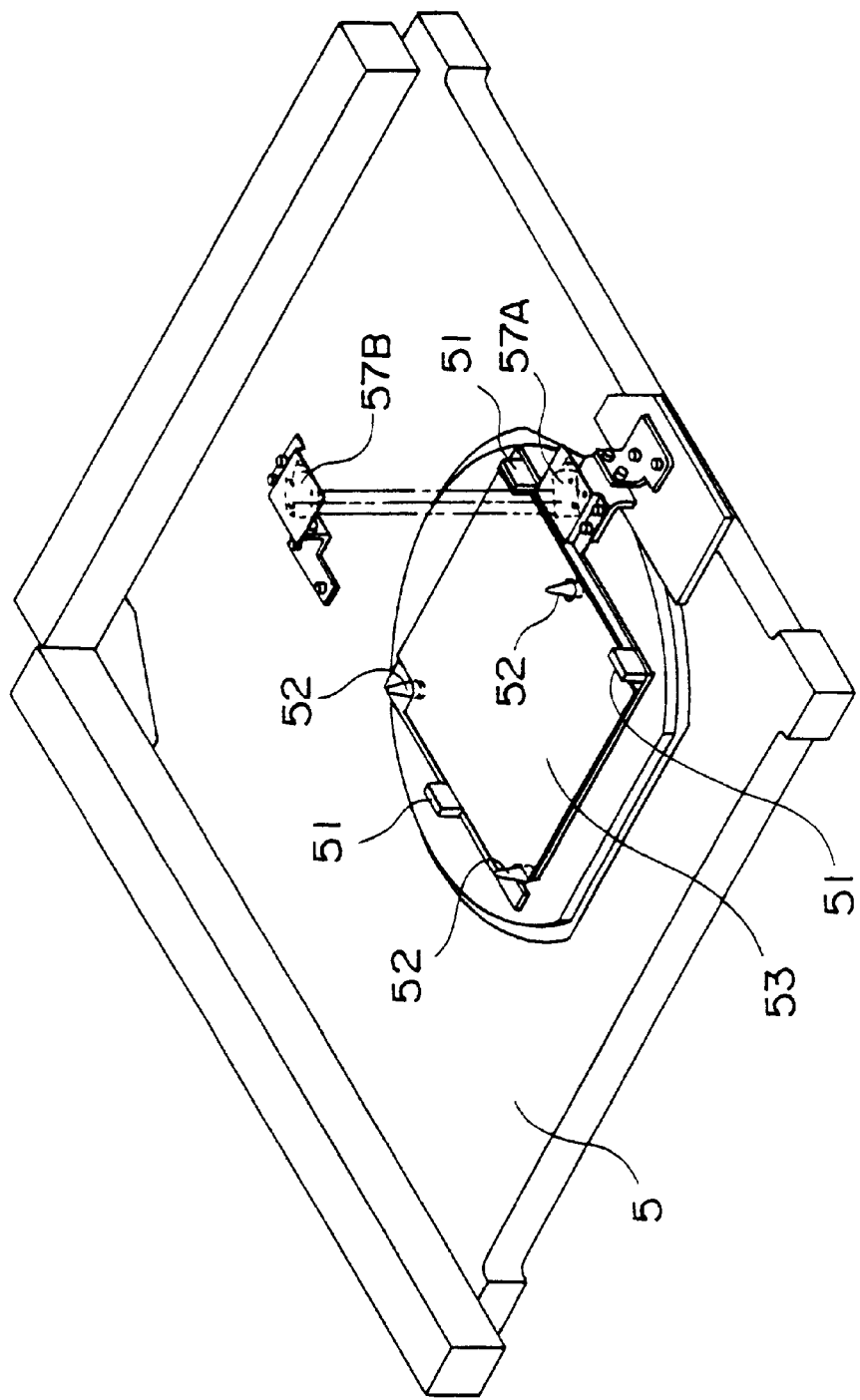
FIG. 13 is a perspective view of a sample table.

An anti-reflection plate 53 comprised of a glass substrate formed with an anti-reflection film on its surface is arranged as shown in FIG. 10, FIG. 12, or FIG. 13. The anti-reflection plate 53 is formed to a shape avoiding the support pins 52 and is of a shape which includes at least portions corresponding to the pattern area 25 and the alignment mark areas MA1 of the substrate 4. Note that it is desirable to also include the information mark areas MA2.

Further, the anti-reflection plate 53, as shown in FIG. 12, is integrally fixed on the sample table 5 below the substrate 4 carried on the support pins 52 so that the substrate 4 will not come in contact with it. Note that it is also possible not to provide such an anti-reflection plate 53, but to directly form the anti-reflection film on the surface of the sample table 5 or a structure on the sample table 5. Alternatively, a deflecting member to deflect exposure light IL so as not to return to the substrate 4 may be provided on the sample table 5 or the other.

On the sample table 5, as shown in FIG. 13, is provided a sensor for directly detecting if a substrate 4 is carried on the support pins 52. This sensor has a light emitter 57A outputting detection light and a light receiver 57B receiving the detection light from the light emitter 57A. Further, the light emitter 57A and the light receiver 57B are arranged so as the line connecting them forms an angle of substantially 45° with respect to the two sides (side surfaces) of the substrate forming one corner near that corner in the state with the substrate 4 placed on the support pins 52. When a substrate 4 is placed on the support pins 52, the detection light from the light emitter 57A is reflected, scattered, or absorbed at the corresponding end surface of the substrate 4 and does not reach the light receiver 57B. On the other hand, when a substrate is not placed on the support pins 52, the detection light from the light emitter 57A is received by the light receiver 57B. Therefore, it is possible to reliably detect if a substrate 4 is carried by the receipt of the detection light by the light receiver 57B. It should be noted that the detection light may have the same wavelength as that of the exposure light IL. In this embodiment, however, the wavelength of the detection light is not the same as that of the exposure light IL in order to avoid unnecessary exposure of the photoresist on the substrate 4.

This sensor may also be arranged so that the detection light passes vertically through the substrate 4. In either case, however, while the detection light differs in wavelength from the exposure light IL for pattern transfer, it does not entirely have no effect on the photoresist coated on the surface of the substrate 4, so the sensor is preferably set at a position where light is not emitted to the pattern area as much as possible.

The sample table 5 where various devices or members including these support pins 52 are provided, as shown in FIG. 1, is affixed on the substrate stage 6. The sample table 5 matches the surface of the substrate 4 with the imaging plane of the projection optical system 3 by control of the focal position (position in optical axis AX direction) and angle of tilt of the substrate 4 by the auto focus system. The sample table has affixed to it an illumination distribution detection sensor for detecting the illumination distribution on the positioning use fiducial mark member 12 and substrate 4 (so-called illumination uniformity sensor) 126. Further, the substrate stage 6 moves and positions the sample table 5 (substrate 4) on the base 7 in the X-direction and Y-direction by for example a linear motor.

The X-coordinate, Y-coordinate, and rotational angle of the sample table 5 are measured by movable mirrors 8$m$ affixed above the sample table 5 and laser interferometers 8 arranged facing them. The measured values are supplied to a stage control system 10 and main control system 9. "Movable mirrors 8$m$" is a generic term for the X-axis movable mirror 8$m$X and the Y-axis movable mirror 8$m$Y as shown in FIG. 4. The stage control system 10 controls the operation of the linear motor etc. of the substrate stage 6 based on the measured values and the control information from the main control system 9.

Figure 5:
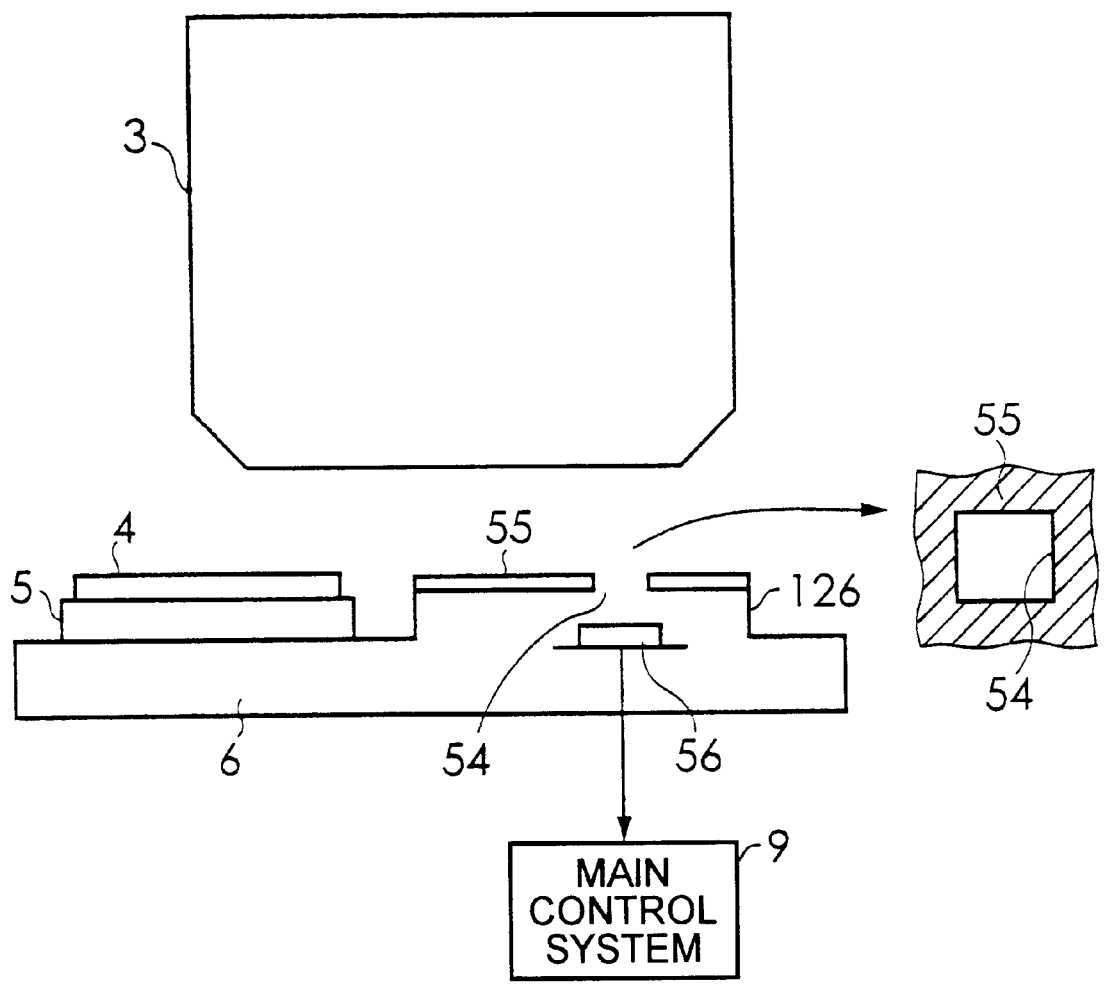
FIG. 5 is a view of the configuration of an illumination distribution detection sensor.

The illumination distribution detection sensor 126, as shown in FIG. 5, is for measuring the spatial distribution of the exposure light IL, that is, the intensity distribution (illumination distribution) of the exposure light, by making the substrate stage 6 move in a plane horizontal with the substrate 4 in the state with the exposure light IL illuminated through the projection optical system 3. The illumination distribution detection sensor 126 is comprised of a photoelectric sensor 56 provided below the light blocking plate 55 having the rectangular (in the present embodiment, square) aperture 54. The detection signal of the photoelectric sensor 56 is output to the main control system 9. Note that, it is possible to not provide a photoelectric sensor 56 below the aperture 54, but to guide the light by a light guide etc. and have the amount of light received detected by a photoelectric sensor etc. at another portion.

The main control system 9 has connected to it a magnetic disk drive or other storage device 11. The storage device 11 stores an exposure data file. The exposure data file records the positional relationship among the master reticles R1 to RN, the correspondence of the density filters F1 to FL with respect to the master reticles R1 to RN, the alignment information, etc.

The exposure apparatus according to the present invention performs stitch exposure using a plurality of master reticles. This exposure apparatus is configured as a reticle exposure apparatus for producing a working reticle 34 in this embodiment, but can also be configured as a device exposure apparatus used when producing a semiconductor integrated circuit. The method of producing the reticle produced using this master reticle Ri and this exposure apparatus, that is, the working reticle 34, will be explained in brief next.

Figure 6:
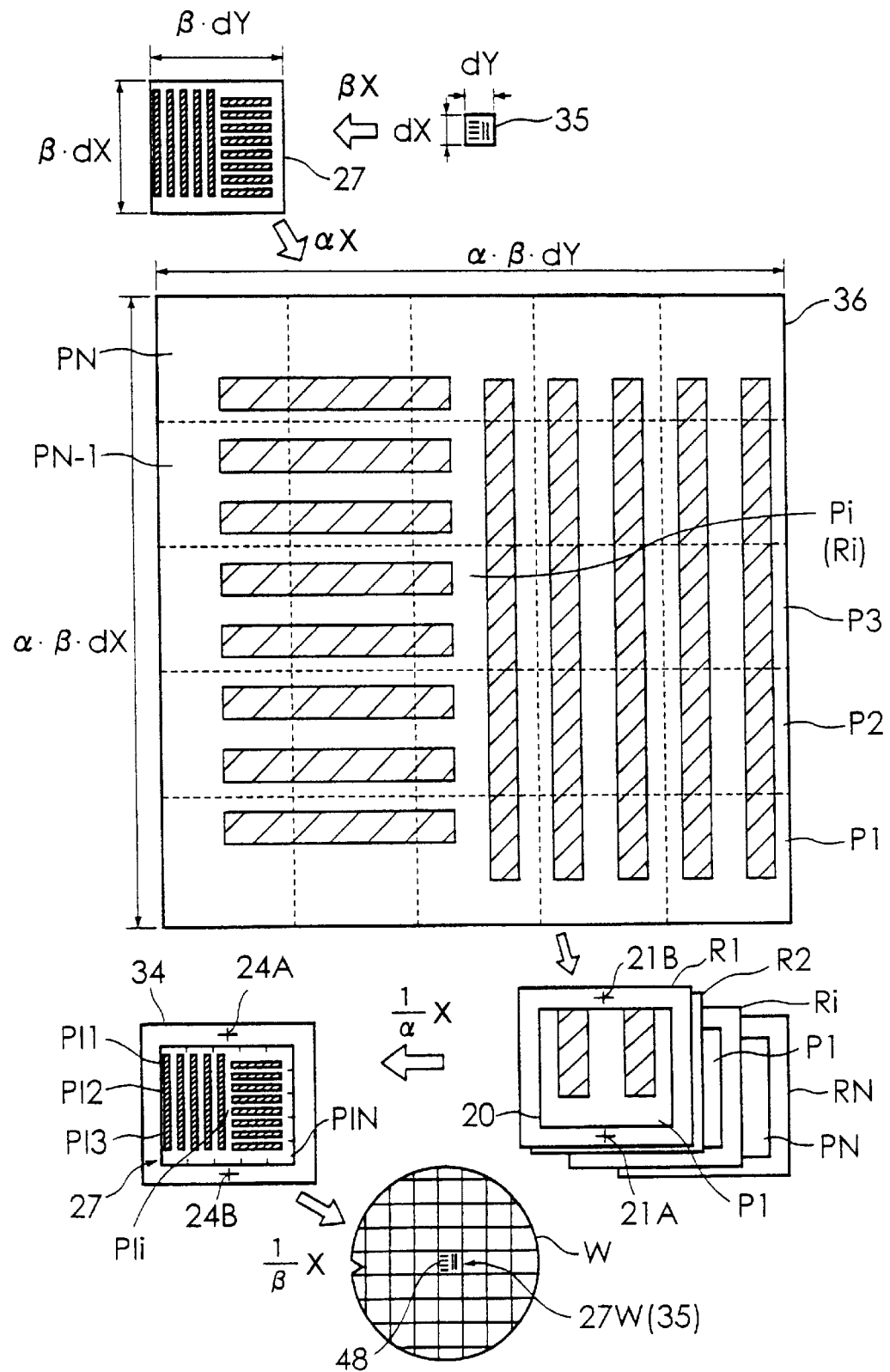
FIG. 6 is a view for explaining a process of production when producing a reticle (working reticle) using a master reticle.

FIG. 6 is a view for explaining the process of production when producing a reticle (working reticle) using a master reticle Ri. The working reticle 34 shown in FIG. 6 is the finally produced reticle. In this embodiment, the working reticle 34 is a half tone type phase shift reticle comprised of a light transmitting substrate made of quartz glass or the like on one surface of which is formed a master pattern 27 by a half tone film made of the above mask material and designed to a transmittance of 10 to several percent.

The working reticle 34 is used in reduction projection of $1/\beta$ (where $\beta$ is an integer larger than 1 or a half integer etc., for example, 4, 5, or 6) through a projection optical system of an optical type projection exposure apparatus. That is, in FIG. 6, a reduced image 27W of $1/\beta$ times the master pattern 27 of the working reticle 34 is exposed on each shot area 48 of a wafer W coated with a photoresist, then developed or etched etc. to form a predetermined circuit pattern on each shot area 48.

In FIG. 6, first the circuit pattern 35 of a certain layer of the semiconductor device to be finaly produced is designed. The circuit pattern 35 forms various line-and-space patterns (or isolated patterns) in a rectangular area with widths of perpendicularly intersecting sides of dX and dY. In this embodiment, the circuit pattern 35 is enlarged $\beta$ times to prepare a master pattern 27 comprised of a rectangular area with widths of perpendicularly intersecting sides of $\beta \cdot dX$ and $\beta \cdot dY$ in the image data of the computer. The multiple $\beta$ is a reciprocal of the reduction rate $(1/\beta)$ of the projection exposure apparatus where the working reticle is to be used. Further, the image is inverted and enlarged at the time of inversion projection.

Next, the master pattern 27 is enlarged $\alpha$-fold ($\alpha$ is an integer larger than 1 or a half integer, for example, 4, 5, or 6) to prepare in the image data a parent pattern 36 comprised of a rectangular area with widths of perpendicularly intersecting sides of $\alpha \cdot \beta \cdot dx$ and $\alpha \cdot \beta \cdot dY$. This parent pattern 36 is then divided longitudinally and laterally into $\alpha$ number of sections to prepare $\alpha \times \alpha$ number of parent patterns P1, P2, P3 . . . , PN ($N=\alpha^2$) in the image data. In FIG. 6, the case where $\alpha=5$ is shown. Note that the magnification $\alpha$ is a reciprocal of the projection magnification of a projection exposure system used in production of the working reticle 34 (magnification of the projection optical system 3 shown in FIGS. 1 and 4 in this embodiment). Further, the divisor $\alpha$ of the parent pattern 36 does not necessarily have to match the magnification a of the master pattern 27 to the parent pattern 36. Next, these parent patterns Pi (i=1 to N) are used to produce lithographic data for an electron beam lithography system (or laser beam lithography system) and these parent patterns Pi are transferred on to the master reticle Ri as parent masks at equal magnification rates.

For example, when producing one master reticle Ri, a thin film of chrome or molybdenum silicide or other mask material is formed on a light transmitting substrate of quartz glass etc., an electron beam resist is coated on this, then the electron beam lithography system is used to draw an equal magnification latent image of the first parent pattern P1 on the electron beam resist. Next, the electron beam resist is developed, then is etched and the resist peeled off etc. to form the parent pattern P1 on the pattern area 20 on the master reticle R1.

At this time, alignment marks 21A and 21B comprised of two 2-dimensional marks are formed in a predetermined positional relationship at the parent pattern P1. In the same way, an electron beam lithography system is used to form parent patterns Pi and alignment marks 21A and 21B on other master reticles Ri. These alignment marks 21A and 21B are used for positioning with respect to the substrate or density filter.

In this way, the parent patterns Pi drawn by the electron beam lithography system (or laser beam lithography system) are patterns of the master patern 27 enlarged $\alpha$-times, so the amounts of the lithographic data are reduced to about $1/\alpha^2$ compared with when directly drawing the master pattern 27. Further, the minimum line width of the parent patterns Pi is $\alpha$-times (for example 5-times or 4-times) the minimum line width of the master pattern 27, so the parent patterns Pi can be drawn in a short time and at a high accuracy by an electron beam lithography system using conventional electron beam resists. Further, by producing N number of master reticles R1 to RN at one time, it is possible to produce the number of necessary working reticles 34 by repeatedly using them, so the time for producing the master reticles R1 to RN does not become a large burden. The working recticle 34 is produced by using the thus produced N number of master reticles Ri and transferring the $1/\alpha$-size reduced images PIi (i=1 to N) of the parent patterns Pi of the master reticles Ri while stitching them together (while partially overlaying them).

Details of the exposure operation of the working reticle 34 using the master reticles Ri will be explained next. First, a first shot area on the substrate 4 is moved to the exposure area (projection area) of the projection optical system 3 by step motion of the substrate stage 6. In parallel with this, a master reticle R1 is loaded and held from the reticle library 16b to the reticle stage 2 through the loader 19b, and a density filter F1 is loaded and held from the filter library 16a to the filter stage FS through the loader 19a. The master reticle R1 and the density filter F1 are brought into register etc., then a reduced image of the master reticle R1 is transferred to the corresponding shot area on the substrate 4 through the projection optical system 3.

When the reduced image of the 1st master reticle R1 finishes being exposed on the first shot area on the substrate 4, the next shot area on the substrate is moved to the exposure area of the projection optical system 3 by step motion of the substrate stage 6. In parallel with this, the master reticle R1 on the reticle stage 2 is unloaded to the library 16 through the loader 19, the next master reticle R2 to be transferred is loaded and held from the library 16 to the reticle stage 2 through the loader 19, the density filter F1 on the filter stage FS is unloaded to the library 16 through the loader 19, and the next density filter F2 corresponding to the master reticle R2 to be transferred is loaded and held from the library 16 to the filter stage FS through the loader 19. The master reticle R2 and the density filter F2 are brought into register etc., then a reduced image of the master reticle R2 is transferred to the corresponding shot area on the substrate 4 through the projection optical system 3.

After this, by the step-and-repeat system, reduced images of the corresponding master reticles R3 to RN are successively transferred and exposed on to the remaining shot areas of the substrate 4 while suitably changing the density filters F2 to FN according to need.

Note that when projecting and exposing the reduced images of the master reticles R1 to RN on the substrate 4 in this way, it is necessary to stitch the adjoining images at a high accuracy. Toward this end, it is necessary to align the master reticles Ri (i=1 to N) and the corresponding shot areas (Si) on the substrate 4 with a high accuracy. For this alignment, the projection exposure apparatus of the present embodiment is provided with reticle and substrate alignment mechanisms.

Figure 7:
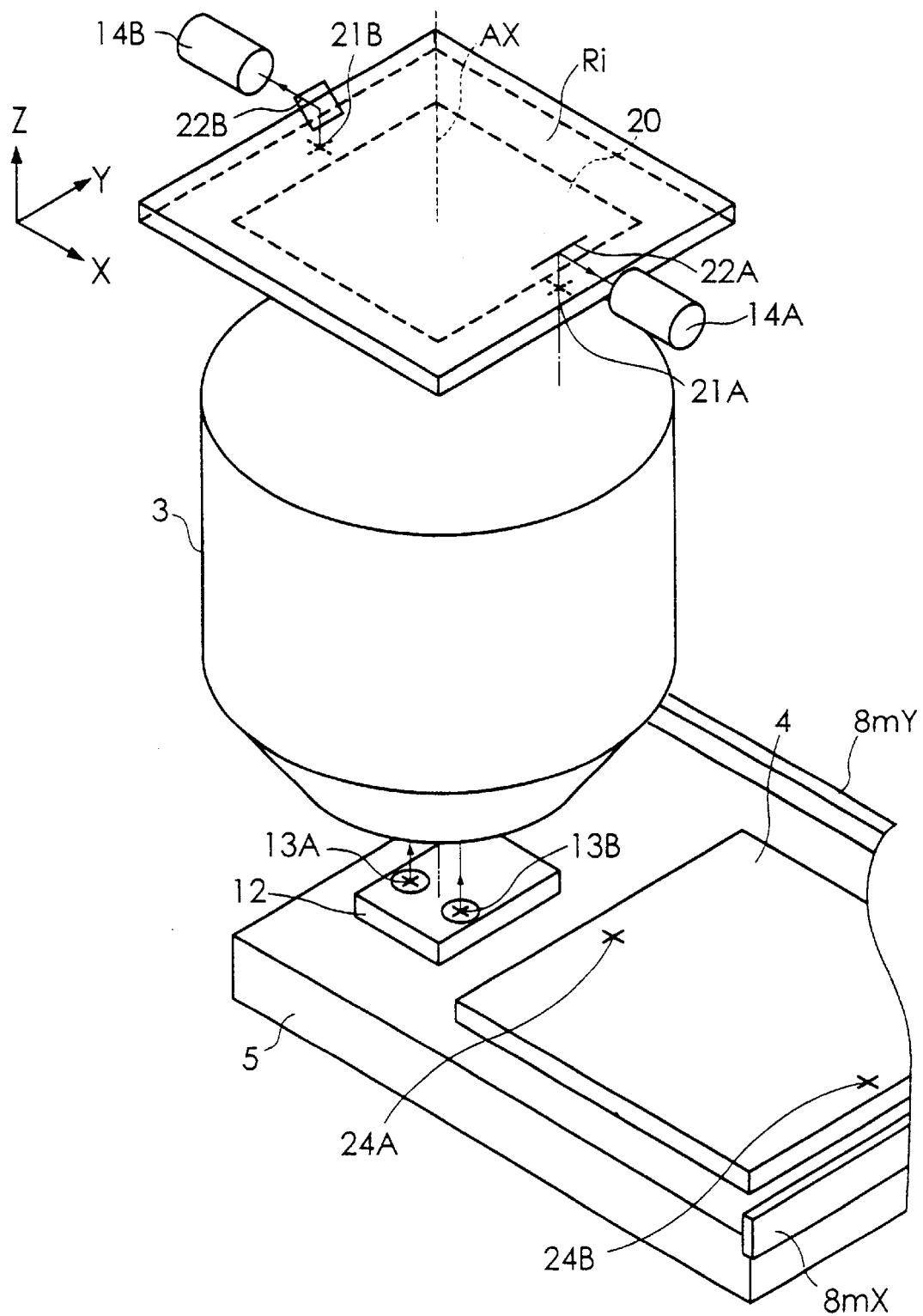
FIG. 7 is a perspective view of an alignment mechanism of a reticle.

FIG. 7 shows the reticle alignment mechanism. In FIG. 7, a light transmitting fiducial mark member 12 is affixed near the substrate 4 on the sample table 5. Two cross-shaped fiducial marks 13A and 13B are for example formed at a predetermined interval in the X-direction on the fiducial mark member 12. At the bottoms of the fiducial marks 13A and 13B is placed an illumination system for illuminating the fiducial marks 13A and 13B at the projection optical system 3 side by illumination light branched from the exposure light IL. When aligning a master reticle Ri, the substrate stage 6 of FIG. 1 is driven to position the fiducial marks 13A and 13B so that the center point between the fiducial marks 13A and 13B on the fiducial mark member 12 substantially registers with the optical axis AX of the projection optical system 3 as shown in FIG. 7.

Further, for example, two cross-shaped alignment marks 21A and 21B are formed so as to straddle the pattern area 20 of the pattern surface (bottom surface) of the master reticle Ri in the X-direction. The distance between the fiducial marks 13A and 13B is set to be substantially equal to the distance between images of the alignment marks 21A and 21B reduced by the projection optical system 3. By illumination by illumination light of the same wavelength as the exposure light IL from the bottom of the fiducial mark member 12 in the state with the center point between the fiducial marks 13A and 13B substantially in register with the optical axis AX in the above way, images of the fiducial marks 13A and 13B enlarged by the projection optical system 3 are formed near the alignment marks 21A and 21B of the master reticle Ri.

Mirrors 22A and 22B are arranged above the alignment marks 21A and 21B to reflect the illumination light from the projection optical system 3 side in the ±X directions. Image processing type alignment sensors 14A and 14B are provided by a TTR (through-the-reticle) system so as to receive the illumination light reflected by the mirrors 22A and 22B. The alignment sensors 14A and 14B are each provided with an imaging system and a 2-dimensional image pickup element such as a CCD camera. The image pickup elements pick up the images of the alignment marks 21A and 21B and the corresponding fiducial marks 13A and 13B and supply image signals to an alignment signal processing system 15 of FIG. 1.

The alignment signal processing system 15 processes the image signals to find the amount of positional deviation of the alignment marks 21A and 21B in the X-direction and Y-direction with respect to the fiducial marks 13A and 13B and supplies the two positional deviations to the main control system 9. The main control system 9 positions the reticle stage 2 so that the two positional deviations become symmetrical and within predetermined ranges. Due to this, the alignment marks 21A and 21B and in turn the parent pattern Pi in the pattern area 20 of the master reticle Ri (see FIG. 6) are positioned with respect to the fiducial marks 13A and 13B.

In other words, the center (exposure center) of the reduced image of the parent pattern Pi of the master reticle Ri obtained by the projection optical system 3 is positioned at the center point between the fiducial marks 13A and 13B (substantially the optical axis AX) and the perpendicularly intersecting sides of the contour of the parent pattern Pi (contour of pattern area 20) are set to be parallel to the X-axis and Y-axis. In this state, the main control system 9 of FIG. 9 stores the X-direction and Y-direction coordinates $(XF_0, YF_0)$ of the sample table 5 measured by the laser interferometers 8, whereby the alignment operation of the master reticle Ri ends. After this, it is possible to move any point on the sample table 5 to the exposure center of the parent pattern Pi.

Further, as shown in FIG. 1, an image processing type alignment sensor 23 is provided by an off-axis system at the side of the projection optical system 3 to detect the position of a mark on the substrate 4. The alignment sensor 23 illuminates a detection mark by illumination light of a wide band to which the photoresist is not sensitive, picks up the image of the detection mark by a 2-dimensional image pickup element such as a CCD camera, and supplies an image signal to the alignment signal processing system 15. Further, the distance (base line amount) between the detection center of the alignment center 23 and the center of the projected image of the pattern of the master reticle Ri (exposure center) is found in advance using a predetermined fiducial mark on the fiducial mark member 12 and stored in the main control system 9.

As shown in FIG. 7, two cross-shaped alignment marks 24A and 24B are formed at the ends of the substrate 4 in the X-direction. After the master reticle Ri is aligned, the substrate stage 6 is driven to successively move the fiducial marks 13A and 13B and the alignment marks 24A and 24B on the substrate 4 to the detection area of the alignment sensor 23 of FIG. 1 and measure the positional deviations of the fiducial marks 13A and 13B and the alignment marks 24A and 24B with respect to the detection center of the alignment sensor 23. The results of the measurements are supplied to the main control system 9. Using these measurement results, the main control system 9 finds the coordinates $(XP_0, YP_0)$ of the sample table 5 when the center point between the fiducial marks 13A and 13B is in register with the detection center of the alignment sensor 23 and the coordinates $(XP_1, YP_1)$ of the sample table 5 when the center point between the alignment marks 24A and 24B is in register with the detection sensor of the alignment sensor 23. This ends the alignment operation of the substrate 4.

As a result, the distances between the center point between the fiducial marks 13A and 13B and the center point between the alignment marks 24A and 24B in the X-direction and the Y-direction become $(XP_0-XP_1, YP_0-YP_1)$. Therefore, by driving the substrate stage 6 of FIG. 1 by exactly the distances $(XP_0-XP_1, YP_0-YP_1)$ with respect to the coordinates $(XF_0, YF_0)$ of the sample table 5 at the time of alignment of the master reticle Ri, it is possible to bring the center point between the alignment marks 24A and 24B of the substrate 4 (center of substrate 4) into register with the center point between the projected images of the alignment marks 21A and 21B of the master reticle Ri (exposure center) with a high accuracy as shown in FIG. 4. From this state, the substrate stage 6 of FIG. 1 may be driven to move the sample table 5 in the X-direction and the Y-direction so as to expose a reduced image PIi of a parent pattern Pi of the master reticle Ri at a desired position with respect to the center of the substrate 4.

That is, FIG. 4 shows the state where a parent pattern Pi of an i-th master reticle Ri is reduced and transferred on to the substrate 4 through the projection optical system 3. In FIG. 4, a rectangular pattern area 25 surrounded by sides parallel to the X-axis and Y-axis is virtually set in the main control system 9 centered on the center point between the alignment marks 24A and 24B of the surface of the substrate 4. The size of the pattern area 25 is the size of the parent pattern 36 of FIG. 6 reduced to $1/\alpha$. The pattern area 25 is divided equally into a sections in the X-direction and the Y-direction to virtually set shot areas S1, S2, S3, . . . , SN ($N=a^2$). The position of a shot area Si (i=1 to N) is set to the position of a reduced image PI of the i-th parent pattern Pi when assuming reducing and projecting the parent pattern 36 of FIG. 1 through the projection optical system 3 of FIG. 4.

Further, when exposing one substrate 4, regardless of the change of the master reticle Ri, the substrate 4 is placed, without suction, on the substrate holder comprised of the three support pins 52 and the substrate stage 6 is made to move by a super-low acceleration and a super-low speed so that the position of the substrate 4 does not shift at the time of exposure. The surfaces of the support pins 52 which abut against the substrate 4, however, are set to a surface roughness higher than a predetermined roughness as explained above and are set to a predetermined diameter (area), so a sufficient frictional force is obtained. Even if the acceleration and the speed are increased to a certain extent, the positional relationship between the fiducial marks 13A and 13B does not change, so when exchanging the master reticles Ri, it is sufficient to position the master reticle Ri with respect to the fiducial marks 13A and 13B. There is no need to detect the positions of the alignment marks 24A and 24B for each master reticle.

Note that when the tip surfaces of the support pins 52 are made diameters of 1.5 mm, are given surface roughness of 1 $\mu$Ra, and are comprised of sapphire materials, the substrate 4 will not shift in position etc. at a speed of movement of the stage of 11 mm/s and an acceleration of ½₀₀G or so and a stable state sufficient for practical use can be maintained. According to experiments by the inventors of the present application, when using a 6-inch reticle, for example, a 6025 size quartz substrate (152 mm square, thickness 6.35 mm, mass 323 g) under the above conditions, it was confirmed that this configuration was effective up to a maximum speed of 40 mm/s and a maximum acceleration of $\frac{1}{100}$G to $\frac{2}{100}$G or so from the viewpoint of prevention of shifting of position of the substrate 4. These speed and acceleration, however, have an effect on the vibration of the system, so the upper limit (maximum value) may change depending on the configuration of the stage. Further, in this example, the substrate 4 was made a 6-inch one, but it is also possible to use another size (5 inch, 9 inch, etc.) Alternatively, it is possible to use the same size, but a different thickness. The upper limits (maximum values) of the speed and acceleration may also change depending on the size or mass of the substrate 4. Further, the above conditions (diameter or area, surface roughness, and material of tips of support pins 52) may change when it is necessary to set the acceleration over the above maximum value due to the relation with the throughput etc. or depending on the size or mass of the substrate 4.

Above, an explanation was given of the positioning of the master reticle Ri and the substrate 4, but the master reticle Ri and the density filter may also be positioned relative to each other based on the results of measurement of the positional information or the marks 124A and 124B or the slit mark 125. At this time, a slight rotation sometimes occurs in the substrate 4 due to the properties of the substrate stage 6, the yawing error, and other error. Therefore, a slight deviation occurs in the relative postures of the master reticle Ri and the substrate 4. This error is measured in advance or measured during actual processing and the reticle stage 2 or substrate stage 6 controlled so that the postures of the master reticle Ri and the substrate 4 are corrected to become in register so as to cancel this error out.

After this processing, the main control system 9 projects and exposes the reduced image of the parent pattern Pi on a shot area Si of the substrate 4. In FIG. 4, a reduced image of a parent pattern already exposed in the pattern area 25 of the substrate 4 is shown by a solid line, while an unexposed reduced image is shown by a broken line.

By successively exposing reduced images of parent patterns P1 to PN of the N number of master reticles R1 to RN of FIG. 1 on the corresponding shot areas S1 to SN of the substrate in this way, the reduced images of the parent patterns P1 to PN are exposed while being stitched with the reduced images of the adjoining parent patterns. Due to this, the projected image 26 of the parent pattern 36 reduced to 1/α is exposed and transferred on to the substrate 4. Next, the photoresist on the substrate 4 is developed and etched and the remaining resist pattern is peeled off, whereby the projected image 26 on the substrate 4 forms the master pattern 27 as shown in FIG. 6 and the working reticle 34 is completed.

The substrate 4 is supported at three points by the support pins 52 at the time of exposure and flexes due to its own weight in accordance with the support positions and the thickness, size, and other shapes of the substrate 4. Therefore, correction is required in accordance with the amount of flexing. The correction information for this is stored and held as an exposure data file in the above storage device 11.

FIG. 14 schematically shows the state of the substrate 4 flexing due to its own weight when simply placed by three-point contact. If taking note of a for example square shot area of the substrate 4, in the state of flexing due to support, the shot area deforms as shown by SH1 in the figure. Even if the pattern is transferred and formed accurately in that state, when returning to the ideal state free from flexing after being released from the three-point support, the deformation of the shot area disappears as shown by SH2 in the figure and conversely distortion occurs in the pattern transferred and formed.

Figure 15A:
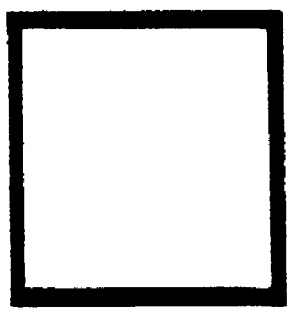
FIG. 15A is a view of the shape of a shot area on a substrate surface before deformation.
Figure 15B:
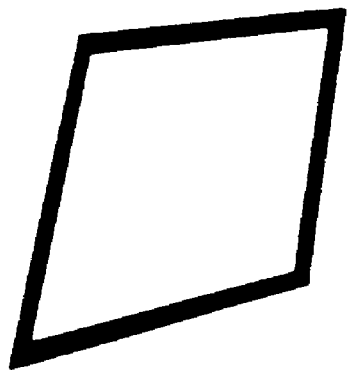
FIG. 15B is a view of the shape of a shot area on a substrate surface after deformation.

To eliminate this distortion of the pattern and transfer and form a pattern of an ideal shape, it is sufficient to perform exposure in a state giving pre-distortion to the projected image so as to cancel out that distortion. For example, when the square shot area shown in FIG. 15A deforms to the shape shown in FIG. 15B, at least one of the optical elements in the projection optical system 3 is moved or otherwise to adjust its optical characteristic (for example, distortion) and at least one of the reticle and substrate stages is moved or otherwise to adjust the geometric relations between the master reticle Ri and substrate 4 (reticle rotation, stepping position, etc.), so as to result in the shape of the shot area shown in FIG. 15B at the time of exposure. Further, in the case of a scan type exposure apparatus, the scan speed and the scan direction etc. are also adjusted.

Specifically, the procedure is as follows: In the state with the substrate 4 supported by a support method the same as the support method in the reticle exposure apparatus, the amount of deformation from an ideal position of the surface of the substrate (here, a point in a state assuming no flexing) is found by actual measurement at n number of points (n is an integer greater than 1) in the shot area to be exposed using the corresponding master or is found by calculation and the results made (dxi,dyi). Here, i=1 to n. Here, considering a model where the point (x,y) of the surface of the substrate 4 displaces to the point (X,Y) due to the deformation of the shot area (magnification, rotation, orthogonality, and offset), the following equation (1) is obtained:

$$\begin{bmatrix} X \\ Y \end{bmatrix} = \begin{bmatrix} a & b \\ c & d \end{bmatrix} = \begin{bmatrix} x \\ y \end{bmatrix} = \begin{bmatrix} e \\ f \end{bmatrix} \quad (1)$$

Here, a=(shot area magnification X)−1, b=−(shot area magnification X)×(rotation+orthogonality), c=(shot area magnification Y)×(rotation), d=(shot area magnification Y)−1, e=(offset X), and f=(offset Y).

To find the deformation of the shot area, it is sufficient to find the a, b, c, d, e, and f giving the minimum E of the following equation (2) by the least square method:

$$E=\Sigma[(Xi-dxi)^2+(Yi-dyi)^2] \qquad (2)$$

The correction values a to f are found for each master reticle Ri and set in the exposure data file of the storage device 11. Based on this, the optical characteristic of the projection optical system 3, reticle rotation, stepping position and the like are finely adjusted to intentionally cause the projected image on the substrate 4 to deform for exposure. Due to this, it is possible to reduce the error occurring due to flexing accompanying support of the substrate 4 and possible to form a pattern with a higher accuracy. Note that here, the correction values a to f were calculated based on the amounts of deformation from the ideal shape of the substrate 4, but in a device exposure apparatus where the working reticle 34 produced using this substrate 4 is used, it is also possible to calculate the correction values a to f based on the amounts of deformation from the shape in the state where the working reticle 34 is supported (in a reticle exposure apparatus, the pattern surface is at the top, but in a device exposure apparatus, the pattern surface is at the bottom) or from the shape in another state.

Next, an explanation will be made of an example of the operation in the case of exposure using the working reticle 34 of FIG. 1 produced in the above way.

Figure 8:
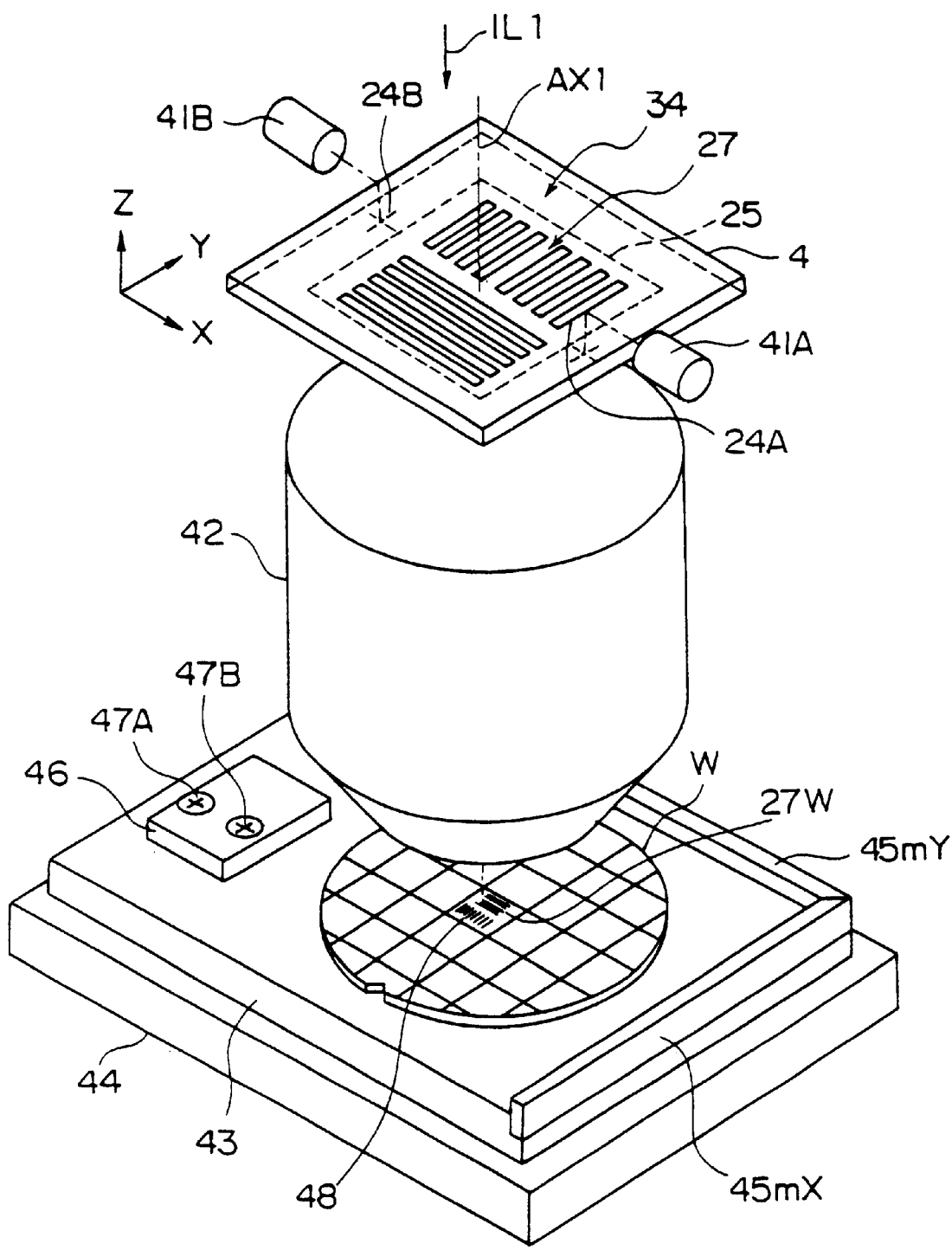
FIG. 8 is a perspective view of key parts of a projection exposure apparatus for projecting a pattern of a working reticle on a wafer.

FIG. 8 shows key parts of a reduction projection type exposure apparatus (device exposure apparatus) mounting a working reticle 34. In FIG. 8, a wafer W is arranged at the bottom surface of the working reticle 34 held on a not shown reticle stage through a projection optical system 42 having a reduction rate 1/β (β is 5, 4, etc.) A photoresist is coated on the surface of the wafer W. The surface is held to be in register with the image plane of the projection optical system 42. The wafer W is held on the sample table 43 through a not shown wafer holder, while the sample table 43 is fixed on an XY stage 44. By driving the XY stage 44 based on the coordinates measured by the movable mirrors 45mX and 45mY on the sample table 43 and the corresponding laser interferometers, the wafer W is positioned.

Further, a fiducial mark member 46 formed with fiducial marks 47A and 47B is fixed on the sample table 43. The working reticle 34 is formed with alignment marks 24A and 24B so as to straddle the pattern area 25 in the X-direction. When the alignment marks 24A and 24B are alignment marks for transferring a pattern on to a pattern area 25 of the working reticle 34, if the marks are used for alignment of the working reticle 34, the relative positional error of the alignment marks 24A and 24B and the pattern area 25 can be expected to be reduced. Alignment sensors 41A and 41B for reticle alignment are arranged above the alignment marks 24A and 24B. In this case as well, the fiducial marks 47A, 47B, the alignment marks 24A, 24B, and the alignment sensors 41A, 41B are used for alignment of the working reticle 34 with respect to the sample table 43 (orthogonal coordinate system XY defined by two laser interferometers).

Next, when performing overlay exposure, a not shown wafer alignment sensor is used for alignment of the shot areas 48 on the wafer W. Next, the shot areas 48 on the wafer W to be exposed are successively positioned at the exposure position, then excimer laser light or other exposure light IL1 is focused on the pattern area 25 of the working reticle 34 by a not shown illumination optical system, whereby an image 27W of the master pattern 27 in the pattern area 25 reduced by a reduction rate 1/β is exposed on the shot area 48. After the reduced image of the master pattern 27 is exposed on each shot area of the wafer W in this way, the wafer W is developed, etched, and otherwise processed, whereby the circuit pattern of a layer of the semiconductor device is formed in each shot area of the wafer W.

According to the above embodiment, since the substrate 4 is supported at three locations outside of the illuminated areas of the substrate (pattern area 25, alignment mark areas MA1, and information mark areas MA2), even if the substrate 4 to be exposed transmits light such as a substrate for production of a half tone type phase shift reticle, it is possible to prevent the light passing through the substrate from being reflected by the support pins 52. Note that the substrate 4 should preferably be supported by the support pins 52 outside the above-mentioned illuminated areas but the supporting position may be set outside at least the pattern area 25 included in the illuminated areas. Further, since the anti-reflection plate 53 is provided on the sample table 5, the light passing through the substrate 4 is absorbed by the anti-reflection plate 53 and no reflected light is produced. Therefore, the photoresist coated on the surface of the substrate 4 no longer ends up being exposed by the reflected light of the light passing through the substrate 4 and consequently there is no longer deterioration of the line width uniformity of the pattern or uniform deviation of the line width from the target line width and a high accuracy pattern can be formed. It is possible to also eliminate damage to the pattern area 25 of the substrate 4 due to the support pins 52. It should be noted that an anti-reflection layer may be formed on each of the surfaces of the support pins 52. In this case, the positions of the support pins 52 may not be restricted as in the above.

Further, according to the present embodiment, while the substrate 4 is being loaded from the substrate cassette on to the support pins 52, it is supported by the support pins 52 at portions different from the positions against which the substrate supports 50A, 51, etc. of the substrate cassette, the robot arm 50 of the transport system, and the center table abut, so even if dust etc. deposits on the substrate supports 50A, 51, etc. and that dust etc. end up depositing on the substrate 4 during transport, that dust etc. does not have any effect on how the substrate 4 is supported by the support pins 52. Accordingly, the substrate flexes ideally by its own weight, it becomes possible to reliably eliminate error due to that flexing using correction values found in advance for the case of ideal flexing of the substrate due to its own weight, and there is less occurrence of error in the shape of the pattern formed. Further, since the flexing becomes ideal, there is no longer an increase in the amount of the leveling operation and a decline in the throughput can be prevented.

Further, since the diameter (area), surface roughness, and material of the tip surfaces of the support pins 52 supporting the substrate 4 are suitably set as explained above, it is possible to suppress positional deviation of the substrate 4 accompanying step motion of the stage without use of suction holding or other means causing irregular or local deformation in the substrate 4 and possible to improve the accuracy of the shape of the pattern without causing that great a decline in the throughput. As explained above, however, it is also possible to make dual use of soft suction of an extent where deformation of the substrate 4 does not cause a problem.

Further, since whether a substrate 4 has been placed on the support pins 52 is directly detected by an optical sensor, the reliability of detection is high and it is possible to reduce the occurrence of misfeed, double loading, and other problems.

When exposing a substrate 4 by the above reticle exposure apparatus to produce a working reticle 34 and using this working reticle 34 to exposure a wafer or other device substrate by a device exposure apparatus, the following is preferable when aligning the working reticle 34 in the reticle exposure apparatus with reference to its external shape and aligning the working reticle 34 in the device exposure apparatus with reference to its external shape.

Figure 16A:
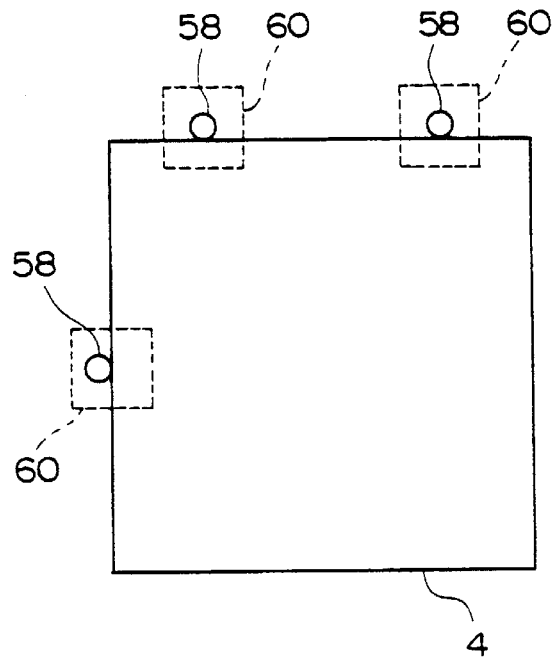
FIG. 16A and FIG. 16B are views of the relationship between alignment of a substrate in a reticle exposure apparatus and alignment of a working reticle in a device exposure apparatus.
Figure 16B:
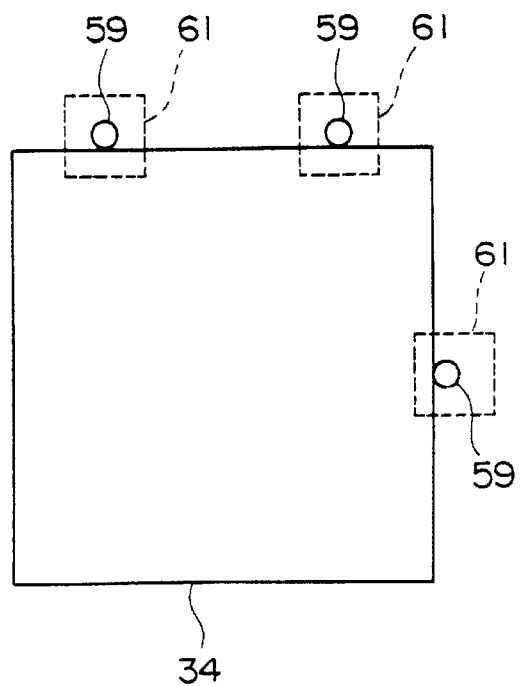

That is, for example, in the device exposure apparatus, as shown in FIG. 16B, the working reticle 34 is made to abut against fiducial pins (shown by circles) at three predetermined locations of its external shape to adjust the posture of the working reticle 34, while in the reticle exposure apparatus for producing the working reticle 34, as shown in FIG. 16A, the substrate 4 is made to abut against fiducial pins (shown by circles) at three predetermined locations of its external shape to adjust the posture of the substrate 4. In this case, the three locations against which the substrate 4 abuts against fiducial pins 58 are made the same positions as the three locations at which the working reticle 34 abuts against the fiducial pins 59. Further, in FIG. 16A and FIG. 16B, the portions abutting against the fiducial pins 58 and 59 are symmetrical to the right and left. This is because in the reticle exposure apparatus, the substrate 4 is held in the state with the surface on which the pattern is to be formed facing upward, while in the device exposure apparatus, the substrate 4 is held in the state with the surface on which the pattern is to be formed facing downward. The portions abutting against the fiducial pins are the same in position. Note that it is also possible not to use such fiducial pins 58 and 59, but to use a CCD or other image sensor to pick up images of three image processing areas (rectangular areas shown by broken lines) and similarly make adjustments by a non-contact method. In this case as well, processing is performed in the reticle exposure apparatus and the device exposure apparatus with reference to the same positions.

Figure 17:
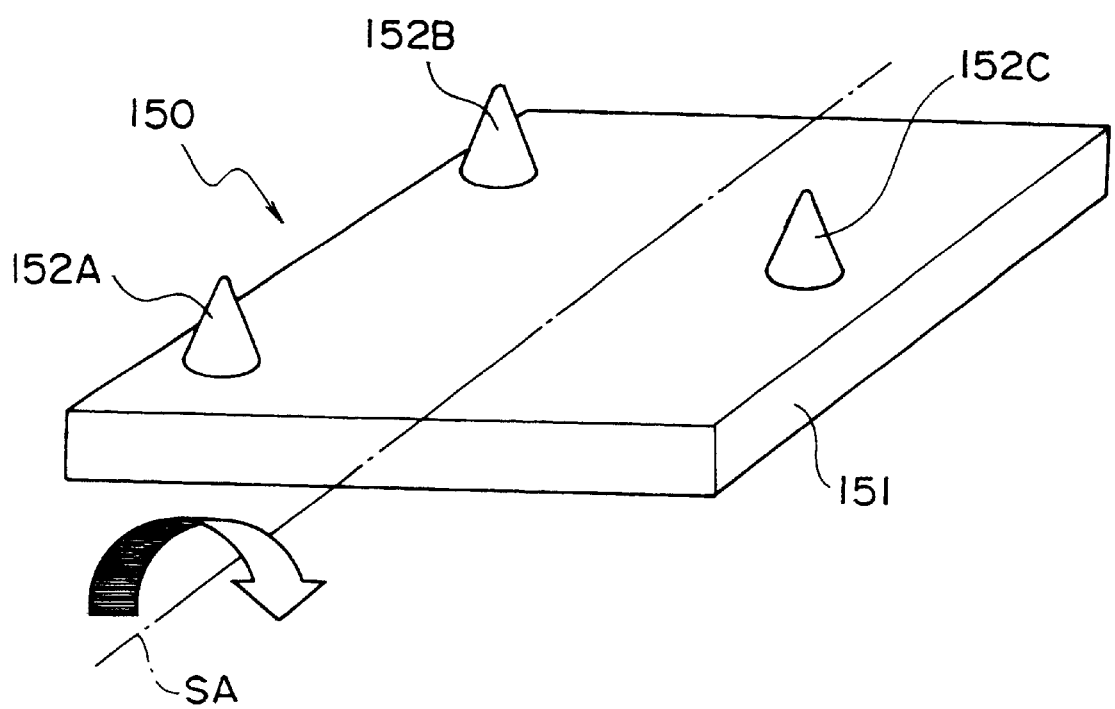
FIG. 17 is a perspective view of another substrate holder from its upper side.
Figure 18:
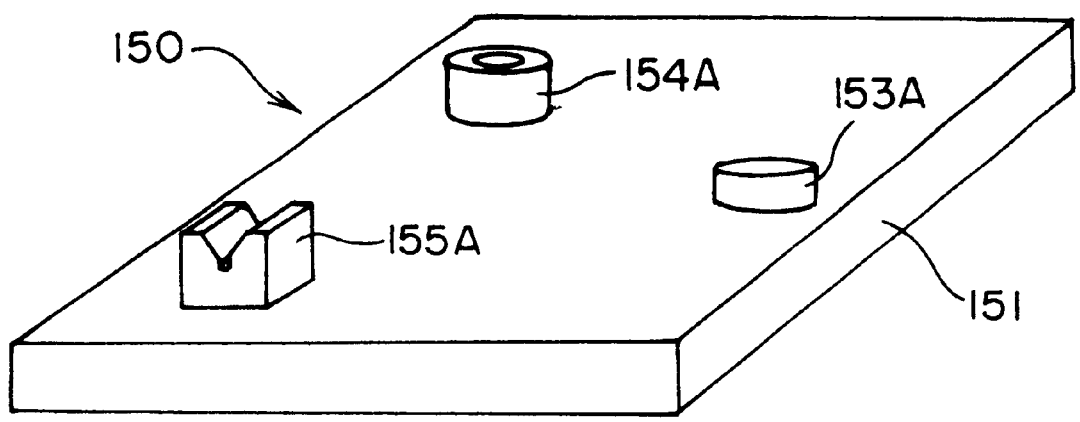
FIG. 18 is a perspective view of the other substrate holder from its lower side.
Figure 19:
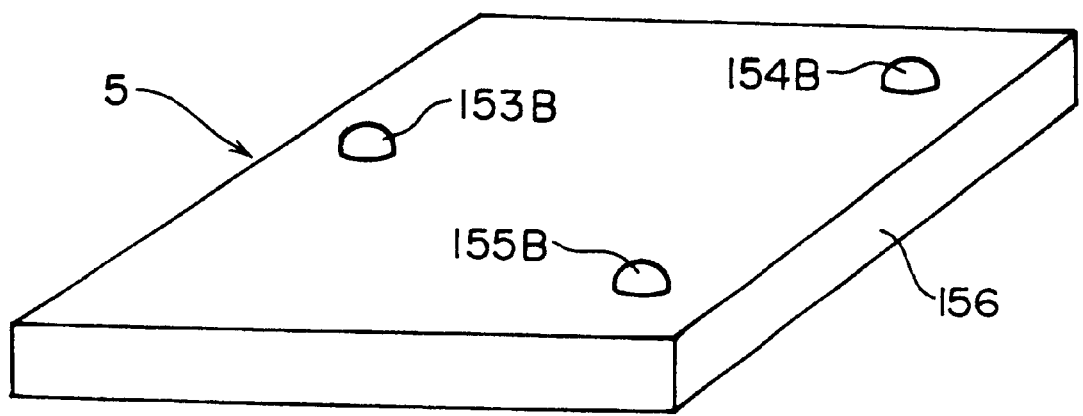
FIG. 19 is a perspective view of a part of the sample table on which the other substrate holder is mounted.

Although in the above embodiment, the three support pins 52 may be provided on the sample table 5, the substrate holder on which the three support pins 52 are formed is secured to the sample table 5 by vacuum suction for example. That is, the substrate holder and hence the three support pins 52 are fixed integrally to the sample table 5. Variations of the substrate holder and substrate holder supporting structure will be described herebelow with reference to FIGS. 17 and 18. FIG. 17 is a perspective view of the substrate holder from its upper side. FIG. 18 is a perspective view of the substrate holder from its lower side, and FIG. 19 is a perspective view of a part of the sample table (holder support portion) on which the substrate holder is mounted. FIG. 18 shows a substrate holder 150 shown in FIG. 17, rotated 180° about an imaginary axis SA. in the direction of arrow.

The substrate holder 150 is provided with a holder plate 151 independent of the sample table 5 as the moving body. The holder plate 151 is formed rectangular as shown in FIG. 17. It should be noted however that the holder plate 151 may be formed circular or otherwise. The holder plate 151 has three support pins 152A to 152C fixed on the upper side thereof. Since these support pins 152A to 152C are constructed and arranged similarly to the aforementioned support pins 52 and their variations, they will not be described any longer.

The substrate holder 150 thus constructed is kinematically supported on the sample table 5 by means of a kinematic coupler. The kinematic coupler used in this embodiment consists of three couplers. As shown in FIG. 18, the holder plate 151 has fixed to the lower side thereof one (first member) of a pair of members forming together each coupler, 153A, 154A or 155A. On the other hand, as shown in FIG. 19, the holder support 156 provided on the sample table 5 has fixed thereto one (second member) of the pair of members forming together each coupler, 153B, 154B or 155B. In this embodiment, with consideration given to the supporting stability, the kinematic coupler composed of the three couplers is used to support the substrate holder 150 on the sample table 5. It is of course however that the substrate holder 150 may be supported with a kinematic coupler consisting of four or more couplers.

In this embodiment, the substrate holder 150 is supported by the kinematic coupler composed of three couplers including a first coupler formed from the first member 153A having a flat surface and second member 153B having a hemispherical projection abutting against the first member 153A, a second coupler formed from the first member 154A having a conical (hemispherical or cylindrical) concavity and second member 154B having a hemispherical projection engaged in the first member 154A, and a third coupler formed from the first member 155A having a V-shaped concavity and second member 155B having a hemispherical projection being slidable along the V-shaped concavity of the first member. In this embodiment, the second members 153B, 154B and 155B are identical in shape to each other, but they may not have the same shape. Also, note that the first members 153A, 154A and 155A may be provided at the sample table 5 while the second members 153B, 154B and 155B may be provided at the substrate holder 150. Further, a kinematic coupler may be used which is composed of a first coupler formed from a first member having a cylindrical (or tapered) projection and a second member having formed therein a concavity in which the cylindrical projection of first member is engaged, a second coupler formed from a first member having a concavity formed therein and a second member having a cylindrical (or tapered) projection engaged in the concavity of the first member, and a third coupler formed from a fist member having a V-shaped concavity formed therein and a second member having an inverted V-shaped projection being slidable along the V-shaped concavity of the first member.

The first members 153A, 154A and 155A of each of the first to third couplers provided on the lower side of the holder plate 151 are disposed not to overlap the three support pins 152A to 152C located on the upper side of the holder plate 151. More specifically, each of the first to third members 153A, 154A and 155A is disposed such that the first member 153A of the first coupler comes to a substantially intermediate position between the support pins 152A and 152B and the remaining support pin 152C comes to a substantially intermediate position between the first member 154A of the second coupler and the first member 155A of the third coupler. The geometric relation between the support pins 152A to 152C and first members 153A, 154A and 155A is set as in the above to assure a stable support of the substrate. Even if the sample table 5 for example is oscillated in the Z-direction, it is possible to reduce the oscillation being transmitted directly to the support pins 152A to 152C via the first members 153A, 154A and 155A.

When the substrate holder 150 is placed on the holder support portion 156 on the sample table 5 shown in FIG. 19 in a state shown in FIG. 17, the second member 153B of the first coupler abuts the first member 153A, the second member 154B of the second coupler is engaged on the first member 154A, and the second member 155B of the third coupler is engaged on the first member 155A, whereby the substrate holder 150 is set on the sample table 5. Namely, the position and posture of the substrate holder 150 on the sample table 5 are assured by the first to third couplers.

In this embodiment, the first coupler is of a type being slidable in an arbitrary direction in the horizontal plane, the second coupler is of a type being not slidable in any horizontal direction, and the third coupler is of a type being slidable only in a predetermined direction in the horizontal plane. Such a construction is adopted to assure a sufficient stability of supporting and inhibit a stress from acting on the substrate holder 150 due to differences in coefficient of thermal expansion and dimensions between the substrate holder 150 and holder support portion 156.

However, all the three couplers may be of a type not slidable in the horizontal direction. Also, one of the couplers may be of a type being not slidable in the horizontal direction while the other two couplers may be of types being slidable only in predetermined directions, respectively. Further, all the three couplers may be of types being slidable only in predetermined directions. In case a coupler of the type slidable in the horizontal direction is adopted, the sliding direction should desirably be optimized for a higher stability of supporting and the like correspondingly to the moving direction of the sample table 5 as the moving body.

In this embodiment, the substrate holder 150 is settable just by placing it on the holder support portion 156 on the sample table 5. Therefore, the substrate holder 150 can be set extremely easily. However, a vacuum mechanism or the like may be provided to secure the substrate holder 150 by vacuum suction. In this case, for keeping clean the substrate holder 150, an arrangement should be made to suck the gas from around the substrate holder 150 in order to remove the gas or the like from the substrate holder 150 and the other.

It should be noted that the present invention is not limited to the aforementioned variations of the kinematic supporting of the substrate holder 150 of which the three support pins 152A to 152C support the substrate 4. The substrate 4 may be supported otherwise than with such support pins or an ordinary substrate holder adapted to support the substrate 4 by plane or line may be supported kinematically as having previously been described. Also, it is of course that there may be provided the aforementioned anti-reflection plate 53 or anti-reflection layer on the substrate holder 150 as a variation and that a detector to detect whether the substrate 4 is set in place may be used.

Further, in the above embodiment, the explanation was given of a reticle exposure apparatus designed to successively stitch and transfer patterns on a blank 4 using a plurality of master reticles Ri, but the invention may be similarly applied to a device exposure apparatus (for example, an exposure apparatus for producing liquid crystal display elements) designed to successively stitch and transfer patterns on a device substrate using a plurality of working masks produced in the above way or produced by another method. That is, the present invention can be applied to a step-and-step type exposure apparatus in which a plurality of areas (shots) to be connected to each other (for example, to partially overlap at the surroundings thereof) on a substrate. Similarly, the present invention is applicable to a step-and-repeat type, step-and-scan type, a proximity type or the similar exposure apparatuses and a mirror projection aligner as well as to the step-and-stitch type exposure apparatus.

The projection exposure apparatus in the above embodiment was a block exposure type apparatus designed for successive repeated block exposure of shot areas, but the invention may also be applied to a scan exposure type apparatus designed for successive repeated scan exposure of shot areas.

Further, in the above embodiment, the shot area was made a rectangular shape, but it does not necessarily have to be a rectangular shape. It may also be a pentagon, hexagon, or other polygon in shape. Further, the shot areas do not have to be the same shapes and may be made different shapes or sizes. Further, the portions to be stitched do not have to be rectangular and may be zigzag strips, serpentine strips, and other shapes as well. Further, the "stitching" in the specification of the present application is used in the sense including not only stitching of patterns, but also arrangement of patterns in a desired positional relationship.

It is also possible to enlarge the device pattern to be formed on the working reticle 34, divide the enlarged device pattern into element patterns, divide these into for example dense patterns and isolated patterns, and then form them on the master reticle to thereby eliminate or reduce the stitching portions of parent patterns on the substrate 4. In this case, depending on the device pattern of the working reticle, sometimes the parent pattern of one master reticle is transferred to a plurality of areas on a substrate 4, so the number of master reticles used for production of the working reticle can be reduced. Further, it is also possible to divide the enlarged pattern into functional block units of for example a CPU, DRAM, SRAM, A/D converter, and D/A converter and form one or more functional blocks at a plurality of master reticles.

In the above embodiment, the illumination light for exposure was made ArF excimer laser light of a wavelength of 193 nm, but it is also possible to use higher ultraviolet light, for example, g-rays and i-rays, and KrF excimer laser or other distant ultraviolet (DUV) light, or $F_2$ laser (wavelength 157 nm), $Ar_2$ laser (wavelength 126 nm), and other vacuum ultraviolet (VUV) light. In a scan type exposure apparatus using an $F_2$ laser as a light source, a catiodioptic optical system is used as the projection optical system, the refraction optical members used for the illumination optical system or the projection optical system (lens elements) are all made of fluorite, the air in the laser light source, illumination optical system, and projection optical system is for example replaced by helium gas, and the space between the illumination optical system and projection optical system and the space between the projection optical system and the substrate are filled with helium gas.

Further, in an exposure apparatus using an $F_2$ laser, the reticle or density filter used is one made of fluorite, fluorine-doped silica glass, magnesium fluoride, LiF, $LaF_3$, and lithium-calcium-aluminum fluoride (LiCaAlF crystal) or rock crystal.

Further, instead of an excimer laser, it is also possible to use a harmonic of a YAG laser or other solid laser having an oscillation spectrum at any of a wavelength of 248 nm, 193 nm, and 157 nm.

Further, it is possible to use an infrared region or visible region single wavelength laser light emitted from a DFB semiconductor laser or fiber laser amplified by for example an erbium (or both erbium and yttrium) doped fiber amplifier and use the harmonic obtained by converting the wavelength to ultraviolet light using a nonlinear optical crystal.

For example, if the oscillation wavelength of the single wavelength laser is made a range of 1.51 to 1.59 μm, an 8th harmonic of an oscillation wavelength in the range of 189 to 199 nm or a 10th harmonic of an oscillation wavelength in the range of 151 to 159 nm is output. In particular, if the oscillation wavelength is made one in the range of 1.544 to 1.553 μm, ultraviolet light of an 8th harmonic in the range of 193 to 194 nm, that is, a wavelength substantially the same as that of an ArF excimer laser, is obtained. If the oscillation wavelength is made one in the range of 1.57 to 1.58 μm, ultraviolet light of a 10th harmonic in the range of 157 to 158 nm, that is, a wavelength substantially the same as that of an $F_2$ laser, is obtained.

Further, if the oscillation wavelength is made one in the range of 1.03 to 1.12 μm, a 7th harmonic of an oscillation wavelength in the range of 147 to 160 nm is output. In particular, if the oscillation wavelength is made one in the range of 1.099 to 1.106 μm, ultraviolet light of a 7th harmonic in the range of 157 to 158 nm, that is, a wavelength substantially the same as that of an $F_2$ laser, is obtained. Note that as the single wavelength oscillation laser, a yttrium-doped fiber laser is used. Further, it is also possible to use light of a soft X-ray region emitted from a laser plasma light source or SOR, for example, EUV (extreme ultraviolet) light of a wavelength of 13.4 nm or 11.5 nm.

The projection optical system is not limited to a reduction system and may also be an equal magnification system or an enlargement system (for example, an exposure apparatus for producing a liquid crystal display or plasma display). Further, the projection optical system may be any of a reflection system, a refraction system, and a catiodioptic system.

Further, the present invention may also be applied to apparatuses other than an exposure apparatus used for the production of a photomask or semiconductor device, such as an exposure apparatus transferring a device pattern on a glass plate used for the production of a display including liquid crystal display elements, an exposure apparatus transferring a device pattern on a ceramic wafer used for production of a thin film magnetic head, an exposure apparatus used for production of a pickup element (CCD), micro machine, DNA chip, and the like.

In an exposure apparatus used for other than production of a photomask (working reticle), the exposure substrate (device substrate) to which the device pattern is to be transferred is held on the substrate stage 6 by vacuum or electrostatics. In an exposure apparatus using EUV rays, however, a reflection type mask is used, while in a proximity type X ray exposure apparatus or electron beam exposure apparatus etc., a transmission type mask (stencil mask, membrane mask) is used, so a silicon wafer etc. is used as the master of the mask.

The exposure apparatus of the present embodiment may be produced by assembling an illumination optical system comprised of a plurality of lenses and a projection optical system into the body of the exposure apparatus and optically adjusting them, attaching the reticle stage or substrate stage comprised of the large number of mechanical parts to the exposure apparatus body and connecting the wiring and piping, and their drive systems (linear motor etc.), and further performing overall adjustment (electrical adjustment, confirmation of operation, etc.) Note that the exposure apparatus is desirably manufactured in a clean room controlled in temperature and cleanness etc.

The semiconductor device is produced through a step of design of the functions and performance of the device, a step of production of a working reticle by the exposure apparatus of the above embodiment based on the design step, a step of transferring a pattern of a working reticle of the reticle on to a wafer using an exposure apparatus of the present embodiment, a step of assembly of the device (including dicing, bonding, packaging, etc.), and an inspection step.

The present invention is of course not limited to the above embodiments and may be modified in various ways within the scope of the invention.

According to the present invention, there is the effect that even when exposing a substrate which has light transmittance, the light passing through the substrate will have less of a detrimental effect on the exposure layer of the substrate and the accuracy of the pattern formed can be enhanced. Further, since there is less entry of dust etc. between the support members and substrate and local deformation of the substrate, the substrate flexes ideally by its own weight and it becomes possible to easily correct deformation of the pattern due to the flexing and therefore possible to achieve high accuracy of the pattern formed. Further, the throughput can be improved. Therefore, it becomes possible to produce a high accuracy, high quality photomask or microdevice. Further, it is possible to reliably detect existence of a substrate and therefore prevent double loading etc.

The present disclosure relates to subject matter contained in Japanese Patent Application No. 2000-054980, filed on Feb. 29, 2000, and Japanese Patent Application No. 2001-025257 filed on Feb. 1, 2001, the disclosure of which is expressly incorporated herein by reference in its entirety.

What is claimed is:

1. An exposure apparatus which exposes a substrate with an exposure beam, comprising:
   a moving body movably disposed on a predetermined surface, on which the substrate is placed to illuminate a sensitive surface of the substrate with the exposure beam; and
   three first support members disposed on the moving body, each of the first support members has a contact surface with a surface of the substrate different from the sensitive surface to support the substrate substantially horizontally, each of the first support members are located at positions in a portion different from an illuminated area with the exposure beam in the sensitive surface of the substrate, the substrate supported by the three first support members being moved by the moving body and being exposed with the exposure beam.

2. An apparatus according to claim 1, wherein the illuminated area includes a pattern area and a mark area at which a pattern and a mark are respectively formed by the exposure.

3. An apparatus according to claim 1, wherein the positions of the first support members are determined so that a warp of the substrate supported by the first support members is minimized.

4. An apparatus according to claim 1, further comprising a transferring unit having a second support member that supports the substrate and is movable to transfer the substrate, and wherein supporting positions of the substrate by the first support members are different from a supporting position of the substrate by the second support member.

5. An apparatus according to claim 4, wherein
   the substrate is supported at three points by the second support member, and
   the first support members and the second support member are arranged so that:
      when one vertex of a first triangle formed by the first support members is designated as a first vertex, the side formed by the two vertices other than the first vertex is designated as a first base, one vertex of a second triangle formed by the second support member is designated as a second vertex, the side formed by the two vertices other than the second vertex is designated as a second base,
      the first base and the second base are substantially parallel,
      the first vertex is positioned at the second base side with respect to the first base, the second vertex is positioned at the first base side with respect to the second base, and parts of the first triangle and the second triangle overlap, the first vertex becomes substantially equal in distance from the two vertices forming the second base and the second vertex becomes substantially equal in distance from the two vertices forming the first base.

6. An apparatus according to claim 1, wherein the substrate has light transmittance.

7. An apparatus according to claim 1, wherein the contact surface of each of the first support members has a roughness set to at least 0.1 μmRa.

8. An apparatus according to claim 7, wherein each of the contact surfaces of the first support members is substantially circular and has a diameter set to 0.5 to 30 mm.

9. An apparatus according to claim 7, wherein the first support members are formed on a substrate holder disposed on the moving body.

10. An apparatus according to claim 9, wherein the substrate holder is kinematically supported by three support members different in position from positions of the first support members.

11. An apparatus according to claim 1, wherein at least the contact surfaces of the first support members are formed by one of diamond, sapphire, ruby, and ceramic.

12. An apparatus according to claim 1, wherein the contact surface of each of the first support members is substantially circular and has a diameter set to 0.5 to 30 mm.

13. An apparatus according to claim 1, wherein the moving body includes an anti-reflection member provided under the substrate to prevent reflection of the exposure beam by the moving body.

14. An apparatus according to claim 1, wherein the first support members are formed on a substrate holder disposed on the moving body.

15. An apparatus according to claim 14, wherein the substrate holder is kinematically supported by three support members different in position from positions of the first support members.

16. An apparatus according to claim 1, further comprising a sensor that optically detects whether a substrate is supported by the first support members.

17. An apparatus according to claim 16, wherein the substrate has a substantially rectangular shape, said sensor has a light emitter for outputting detection light and a light receiver for receiving the detection light from the light emitter, and the light emitter and the light receiver are arranged so that the detection light strikes one surface of the substrate at an angle of about 45° in the state with the substrate supported by the first support members.

18. An apparatus according to claim 1, further comprising a projection optical system disposed on an optical path through which the exposure beam passes, and that has a reduction magnification, wherein reduced images of original patterns are respectively transferred on areas of the substrate through the projection optical system to form a pattern on the areas by stitching exposure of the areas with the exposure beam.

19. An apparatus according to claim 19, wherein the substrate is a mask substrate for production of a working mask.

20. An apparatus according to claim 19, further comprising an alignment apparatus which aligns the substrate, before exposure of the substrate, using fiducial positions the same as at least three fiducial positions to be used for alignment of the working mask at another exposure apparatus at which the working mask produced using the exposure apparatus is to be used.

21. A microdevice produced using an exposure apparatus according to claim 1.

22. A device producing method comprising a lithography step in which the exposure apparatus according to claim 1 is used.

23. A photomask produced using an exposure apparatus according to claim 1.

24. A photomask producing method comprising a lithography step in which the exposure apparatus according to claim 1 is used.

25. An exposure apparatus which exposes a substrate with an exposure beam, comprising:

a substrate holder having a top surface on which the substrate is placed and a bottom surface, and a moving body movably disposed on a predetermined surface, the moving body has three support members abutting against the bottom surface to support the substrate holder, the supported substrate holder being moved by the moving body, and the substrate placed on the supported substrate holder being exposed with the exposure beam.

26. An apparatus according to claim 25, wherein the substrate holder is kinematically coupled on the moving body.

27. An exposure method for exposing a substrate with an exposure beam, comprising:

supporting the substrate substantially horizontally on a moving body disposed on a predetermined surface, by three support members each of which has a contact surface with a different surface from a sensitive surface of the substrate, the three support members are located at positions in a portion different from an illuminated area that is illuminated with the exposure beam in the sensitive surface, the supported substrate being moved by the moving body; and exposing the substrate supported by the three support members with the exposure beam.

* * * * *